US011329447B2

(12) United States Patent
Maker et al.

(10) Patent No.: US 11,329,447 B2
(45) Date of Patent: May 10, 2022

(54) LASER SYSTEM

(71) Applicant: M SQUARED LASERS LIMITED, Glasgow (GB)

(72) Inventors: Gareth Thomas Maker, Glasgow (GB); Stephen Webster, Glasgow (GB)

(73) Assignee: M SQUARED LASERS LIMITED, Glasgow (GB)

(*) Notice: Subject to any disclaimer, the term of this patent is extended or adjusted under 35 U.S.C. 154(b) by 211 days.

(21) Appl. No.: 16/755,690

(22) PCT Filed: Oct. 2, 2018

(86) PCT No.: PCT/GB2018/052811
§ 371 (c)(1),
(2) Date: Apr. 13, 2020

(87) PCT Pub. No.: WO2019/073202
PCT Pub. Date: Apr. 18, 2019

(65) Prior Publication Data
US 2020/0295525 A1   Sep. 17, 2020

(30) Foreign Application Priority Data
Oct. 13, 2017   (GB) .................................. 1716780

(51) Int. Cl.
*H01S 3/13* (2006.01)
*H01S 3/10* (2006.01)
(Continued)

(52) U.S. Cl.
CPC .......... *H01S 3/1305* (2013.01); *G01J 9/0246* (2013.01); *G01J 9/04* (2013.01); *H01S 3/0085* (2013.01);
(Continued)

(58) Field of Classification Search
CPC .. H01S 3/1305; H01S 3/1307; H01S 3/10053; H01S 3/0092; H01S 3/1394; H01S 3/1392; G01J 9/04
See application file for complete search history.

(56) References Cited

U.S. PATENT DOCUMENTS 5,440,207 A * 8/1995 Otsuka .................. H01S 3/1304
315/134
9,170,108 B1 * 10/2015 Qiu ........................ H01S 3/1304
(Continued)

FOREIGN PATENT DOCUMENTS

CN     105577187 A * 5/2016 ............... H01S 3/04
CN     107104354 A * 8/2017
(Continued)

OTHER PUBLICATIONS

International Search Report from PCT/GB2018/052811 dated Mar. 25, 2019.
(Continued)

Primary Examiner — Joshua King
(74) Attorney, Agent, or Firm — FisherBroyles, LLP

(57) ABSTRACT

A laser system comprising two phase-locked solid-state laser sources is described. The laser system can be phase-locked at a predetermined offset between the operating frequencies of the lasers. This is achieved with high precision while exhibiting both low noise and high agility around the predetermined offset frequency. A pulse generator can be employed to generate a series of optical pulses from the laser system, the number, duration and shape of which can all be selected by a user. A phase-lock feedback loop provides a means for predetermined frequency chirps and phase shifts to be introduced throughout a sequence of generated pulses. The laser system can be made highly automated. The above features render the laser system ideally suited for use within coherent control two-state quantum systems, for example
(Continued)

atomic interferometry, gyroscopes, precision gravimeters gravity gradiometers and quantum information processing and in particular the generation and control of quantum bits.

54 Claims, 11 Drawing Sheets

(51) Int. Cl.

| | |
|---|---|
| *G01J 9/02* | (2006.01) |
| *G01J 9/04* | (2006.01) |
| *H01S 3/00* | (2006.01) |
| *H01S 3/131* | (2006.01) |
| *H03L 7/099* | (2006.01) |
| *H01S 3/16* | (2006.01) |
| *H01S 3/23* | (2006.01) |

(52) U.S. Cl.
CPC ........ *H01S 3/10053* (2013.01); *H01S 3/1307* (2013.01); *H01S 3/1312* (2013.01); *H03L 7/099* (2013.01); *H01S 3/0071* (2013.01); *H01S 3/1625* (2013.01); *H01S 3/1636* (2013.01); *H01S 3/2391* (2013.01)

(56) References Cited

U.S. PATENT DOCUMENTS

| | | | | |
|---|---|---|---|---|
| 2003/0185255 A1* | 10/2003 | Ye | ................ | H01S 3/2383 372/18 |
| 2005/0265406 A1* | 12/2005 | Kaertner | ................ | G04G 7/02 372/30 |
| 2010/0303111 A1 | 12/2010 | Kupershmidt | | |
| 2013/0034114 A1* | 2/2013 | Schill | ................ | H01S 3/1305 372/18 |
| 2017/0261832 A1* | 9/2017 | Cingoz | ................ | H01S 3/1307 |

FOREIGN PATENT DOCUMENTS

| | | | |
|---|---|---|---|
| CN | 107104354 A | | 8/2017 |
| JP | H05243663 A | | 2/1992 |
| JP | 05243663 A | * | 9/1993 |
| WO | WO-2013040168 A2 | * | 3/2013 ........... H01S 3/1307 |

OTHER PUBLICATIONS

Courde, C., et al. "Technical Design Note; Elimination of Systematic Errors in Two-Mode Laser Telemetry," Measurement Science and Technology, Dec. 1, 2009; 20:12:127002-2.

Kwon et al., "Development of an Intensity Stabilized Laser System . . . ," Japanese Journal of Applied Physics; Aug. 1, 2003; 42:8A:L2:L924-26.

Miller et al.,Phase-locked, low-noise, frequency Agile Titanium: Sapphire Lasers for Simultaneous Atom Interferometers, Optics Letters; Jul. 27, 2005; 21:2:202-204.

Le Gouet et al.; "Wideband Worked Phase-locked Diode Laser with Intra-cavity Electro-Optic Modulator." Optics Communications; Sep. 22, 2008; 282:5:977-980.

* cited by examiner

LASER SYSTEM

This application is the U.S. National Stage of International Application No. PCT/GB2018/052811, which was filed on Oct. 2, 2018. This application also claims the benefit of the filing date of GB patent application No. 1716780.0, which was filed on Oct. 13, 2017. The contents of both of those applications are hereby incorporated by reference.

The present invention relates to the field of lasers and, in particular, to a laser system comprising two phase-locked laser sources.

The coherent control of two-state quantum systems has been the subject of increased theoretical and experimental studies in recent years. Applications include: atomic interferometry, employed to provide highly sensitive accelerometers, gyroscopes, precision gravimeters and gravity gradiometers.

Atomic interferometry involves inertial (acceleration and or rotation) sensing. In conjunction with precise timing, it can be employed for navigational methods of "dead-reckoning". Measured acceleration is integrated twice with respect to time to derive displacement from an initial starting point. Subsequent positional accuracy is then dependent on the precision of the acceleration measurement and the timing. Inertial sensing based on atom interferometry offers more than an order of magnitude improvement in the precision of acceleration measurement compared to conventional (mechanical) methods. Further, by using an atomic sample, it can measure acceleration in an absolute sense and is not subject to the inherent drifts present in devices based on artefacts (mechanical objects, e.g. a falling corner cube optic).

Gravimetry relates to the detection of small variations in gravitational acceleration or gradients in gravitational acceleration. A precise instrument perceives very small variations in the gravitational field. This can be used for remote sensing of obscured objects and voids and has application in the fields of oil and gas exploration, mining, archaeology, nuclear safety, civil engineering and utilities.

Raman excitation is used to manipulate the internal excitation and external motional states of atoms. Typically, a sequence of three pulses is used. The sequence splits, reflects and then recombines the atomic sample so that two portions of the atomic sample follow separate trajectories. When the atoms undergo an internal transition, the phase of the light is imprinted on the atoms. The phase of the light/atom systems is the metric of the measurement. The brief interactions with the light pulses during the course of the sequence set the phase and act as markers for the progress of the portions of the atomic sample i.e. they act as a "stop-watch" or "ruler" for the phase. The portions of the atomic sample following the two different trajectories experience a different acceleration and are displaced by different amounts. That portion which travels further interacts with light that has accumulated more phase than the light interacting with the portion that has travelled less far. On recombination, this phase difference, due to the difference in displacement, is the measured quantity from which acceleration is derived.

The coherent control of a two-state quantum system is also employed in the field of quantum information processing in which a two-state quantum system, comprising states $|0\rangle$, $|1\rangle$, is commonly referred to as a quantum bit or qubit. Stimulated Raman transitions can be employed to coherently manipulate the two-state quantum system, the value of the qubit thus being determined by the state of the two-level system: either $|0\rangle$, $|1\rangle$ or a superposition of both. The quantum mechanical phenomena of superposition and entanglement allow for a new paradigm in computing in which algorithms can be designed which make use of the parallelism inherent in a properly prepared system of qubits. This opens the possibility of solving problems which are classified as non-computable in conventional computing due to the exponential scaling of the resources required with linear scaling of the input parameter (e.g. the time taken to factorise a large number into prime factors as a function of its digit length).

In all of the above described applications, laser light serves as the means for coherently controlling the two-state quantum systems. By way of further explanation, a simple three level stimulated Raman transition comprising two coherent optical fields is presented in FIG. 1. The aim of the stimulated Raman transition is to coherently drive transitions between ground states $|0\rangle$, $|1\rangle$ through an energetically higher lying, intermediate virtual state $|2\rangle$. This can be achieved by employing two laser sources arranged in a master-slave configuration. That is, a slave laser (SL) is set up to follow a master laser (ML) with a frequency difference $\Delta_{GS}$ set equal to the frequency separation of the ground states $|0\rangle$, $|1\rangle$ of the three-level system.

As can be seen from FIG. 1 the frequency $\omega_M$ of the master laser (ML) is set to couple state $|1\rangle$ to the intermediate state $|2\rangle$ while the frequency $\omega_S$ of the slave laser (SL) is set to simultaneously couple state $|0\rangle$ to the same intermediate state $|2\rangle$. To avoid driving population into the intermediate state $|2\rangle$ the frequency $\omega_M$ of the master laser (ML) and the frequency $\omega_S$ of the slave laser (SL) laser are both detuned from their respective resonant frequencies by $\Delta$.

For a laser system to function as the light source within the above described atomic coherent systems it is necessary that the laser system is capable of performing a number of distinct functions. These include being able to:

1) set and lock the operating frequency of a master laser (ML); and
2) phase lock the slave laser (SL) to the master laser (ML) to stabilise the frequency difference between the operating frequencies of these lasers.

In many applications, it is also desirable to be able to:

3) convert the continuous wave output of the combined master (ML) and slave lasers (SL) to a pulsed output.

In a paper entitled "*Phase-Locked, Low-Noise, Frequency Agile Titanium:Sapphire Lasers for Simultaneous Atom Interferometers*", Optics Letters, Vol. 31, Issue 2, pages 202-204 (2006) by Muller et al, a CW-phase locked system comprising two Ti:sapphire lasers has been demonstrated for use within atom interferometry.

Recent attention has focused on diode lasers to produce a phase-locked laser system. For example, in a paper entitled "*Wide bandwidth phase-locked diode laser with an intra-cavity electro-optic modulator*", Optics Communications, Vol. 282, Issue 5, pages 977-980 (2009) by Le Gouet et al, low noise phase-locking of two independent extended cavity diode lasers is disclosed for use within a cold atom gravimeter. A second example of phase-locked diode lasers is described by Schmidt et at in a paper entitled "*A portable laser system for high-precision atom interferometry experiments*", Applied Physics B, Vol 102, pages 11 to 18 (2011). More recently, a paper by Merlet et al entitled "*A simple laser system for atom interferometry*", Applied Physics B, Vol 117, pages 749 to 754 (2014) discloses the phase locking of two linear extended cavity laser diodes (ECDL) for use within an atom gravimeter.

Diode lasers are however known to exhibit inherently higher frequency noise levels than solid state laser systems e.g. Ti:sapphire lasers. Diode lasers also operate at significantly lower output powers than solid state lasers and thus require the employment of optical amplifiers to reach similar power levels. Such devices, for example tapered amplifier systems, are noisy, distort beam profiles and induce unwanted phase shifts between the two phase locked diode lasers.

SUMMARY OF INVENTION

It is an object of an embodiment of the present invention to obviate or at least mitigate the foregoing disadvantages of the methods and apparatuses for phase-locking two lasers known in the art.

According to a first aspect of the present invention there is provided a laser system comprising a first continuous-wave laser source that provides a first optical field at a first operating frequency, a second continuous-wave laser source that provides a second optical field at a first predetermined offset frequency from the first operating frequency,
the first and second optical fields being combined to produce a combined continuous-wave optical field, and a phase-lock feedback loop that provides a means to phase-lock the second operating frequency to the first operating frequency from an optical beat signal produced by at least a first component of the combined continuous-wave optical field, wherein
the phase-lock feedback loop comprises a first optical beat detector that provides a means for converting the optical beat signal to a first electrical beat signal, a first reference signal generator that provides a means for generating a first reference signal at a second predetermined offset frequency from the first operating frequency, a second reference signal generator that provides a means for generating a second reference signal at a frequency lower than the second predetermined offset frequency and a phase-lock feedback loop electrical circuit that provides a means for generating a first error signal from the first electrical beat signal, the first reference signal and the second reference signal, the first error signal being employed to control a feedback signal for the second continuous-wave laser source.

With this arrangement, a phase-locked laser system is produced that exhibits both low noise and is agile around the first predetermined offset frequency, which is typically of the order of several GHz, when compared with those systems know in the art. The presence of the second reference signal generator provides the means for generating a low frequency second reference signal (typically of the order of MHz) which provides a means for significantly increasing the functionality and frequency agility of an output from the laser system.

Most preferably the second predetermined offset frequency is of a same order of magnitude as the first predetermined offset frequency e.g. GHz. Preferably, the frequency of the second reference signal is one or more orders of magnitude lower than the frequency of the first reference signal e.g. MHz.

Preferably, the second predetermined offset frequency equals the first predetermined offset frequency plus or minus the frequency of the second reference signal.

Optionally the first reference signal generator comprises an Oven Controlled Crystal Oscillator (OCXO) connected to a frequency synthesiser.

Most preferably the second reference signal generator comprises a first Direct Digital Synthesiser (DDS).

Most preferably the phase-lock feedback loop electrical circuit further comprising first and second frequency mixers. Most preferably the first frequency mixer generates a first mixed down output signal from the first electrical beat signal and the first reference signal. In a similar manner, the second frequency mixer generates the first error signal by mixing down the first mixed down output signal and the second reference signal.

Optionally, the first electrical beat signal is passed through a first electrical divider before being mixed with the first reference signal by the first frequency mixer.

Optionally, the first reference signal is passed through a second electrical divider before being mixed with the first electrical beat by the first frequency mixer.

Optionally, the first mixed down output signal is passed through a low pass filter before being mixed with the second reference signal by the second frequency mixer.

Preferably the phase-lock feedback loop comprises a first analogue phase shifter located between the first optical beat detector and the phase-lock feedback loop electrical circuit.

Optionally the laser system further comprises a phase noise monitor that provides a means for compensating for any relative phase noise introduced between the first and second optical fields due to the first and second optical fields not propagating along a common pathway.

Preferably the phase noise monitor is arranged to receive a second optical beat signal produced by a second combined continuous-wave optical field.

Most preferably the phase noise monitor comprises a second optical beat detector that provides a means for converting the second optical beat signal to a second electrical beat signal.

Most preferably the phase noise monitor further comprises a third reference signal generator that provides a means for generating a third reference signal at a third predetermined offset frequency from the first operating frequency.

Most preferably the phase-lock feedback loop electrical circuit comprises a third frequency mixer wherein the third frequency provides a means for generating a second error signal by mixing down the second electrical beat signal and the third reference signal.

Preferably the second error signal is employed to control a feedback signal for adjusting a phase of the first reference signal generated by the first reference signal generator. Adjustment of the phase of the first reference signal may be achieved by employing the feedback to control the Oven Controlled Crystal Oscillator (OCXO). Alternatively, adjustment of the phase of the first reference signal may be achieved by controlling a second analogue phase shifter. The second analogue phase shifter may be located after the OCXO or the frequency synthesiser.

Optionally the third predetermined offset frequency is equal to the first predetermined offset frequency.

Optionally the laser system further comprises a first frequency doubling crystal through which the first optical field propagates. In this embodiment, the laser system further comprises a second frequency doubling crystal through which the second optical field propagates. As a result, the third predetermined offset frequency is double the frequency of the first predetermined offset frequency.

Most preferably, the laser system further comprises a frequency locking feedback loop that provides a means for employing a component of the first optical field to maintain the first operating frequency at a predetermined offset frequency from an atomic transition. In this way, the first output field may be referenced to an atomic transition, without being in resonance with the atomic transition, thus avoiding population being driven into the upper state of the atomic transition.

Preferably the frequency locking feedback loop comprises an optical modulator wherein operation of the optical modulator provides a means for frequency modulating the component of the first optical field at the predetermined offset frequency from the atomic transition thereby providing a frequency sideband of the modulated component of the first optical field that is in resonance with the atomic transition.

Most preferably the frequency locking feedback loop further comprises an atomic saturation absorption spectroscopy module employed to monitor the transmission of the modulated component of the first optical field through an atomic vapour cell.

Preferably the frequency locking feedback loop further comprises a feedback loop electrical circuit that provides a means for generating an electrical feedback signal from an output of the atomic saturation absorption spectroscopy module. Most preferably the electrical feedback signal is employed to control one or more tuning elements of the first continuous-wave laser source to maintain the first operating frequency.

Preferably the atomic saturation absorption spectroscopy module comprises a Rubidium vapour cell.

Alternatively, the atomic saturation absorption spectroscopy module may comprise a Calcium vapour cell. In a further alternative, the atomic saturation absorption spectroscopy module may comprise a Caesium vapour cell. In a yet further alternative the atomic saturation absorption spectroscopy module may comprise a Potassium vapour cell.

Preferably the laser system further comprises a first power feedback loop comprising a photodetector arranged to provide feedback from the first output field to a pump source of the first continuous-wave laser source. Preferably the laser system further comprises a second power feedback loop comprising a photodetector arranged to provide feedback from the second output field to a pump source of the second continuous-wave laser source. In this way, the power of the first and second output fields can be monitored and automatically adjusted as required. This can be achieved by varying the power of the pump lasers and or by adjusting the alignment of the pump lasers into the first and or second continuous-wave laser sources.

Most preferably the laser system further comprises a pulse generator employed to generate a series of optical pulses from a second component of the combined continuous-wave optical field.

The pulse generator preferably comprises an acoustic optic modulator (AOM) system comprising a first acoustic optic modulator (AOM) and an acoustic optic modulator (AOM) electrical circuit employed to generate an input drive signal for the first AOM.

Preferably the AOM electrical circuit comprise a distributed control system (DCS) that is electrically connected to the first AOM by a first variable gain amplifier (VGA). Preferably, an electrical output from the first VGA is controlled by a first digitally controlled switch.

Optionally the distributed control system (DCS) further comprises a first digital output source employed to provide a control signal to open and close the first digitally controlled switch. Most preferably the distributed control system (DCS) further comprises a second direct digital synthesiser (DDS) employed to generate a frequency source for the first AOM e.g. a low frequency source at 80 MHz.

Most preferably the first VGA provides a means for converting the frequency source for the first AOM into a first electrical signal comprising one or more pulses. Preferably the first VGA provides a means for determining the timing, shape and or width of the one or more pulses. Preferably the first digitally controlled switch provides a means for increasing the on/off extinction of the pulses. It may also provide a means for increased control for the timing and width of the pulses within the first electrical signal. When the first AOM is driven by the input drive signal it acts to impart the profile of the series of electrical pulses onto both components of the second component of the combined continuous-wave field to produce the desired pulsed output field.

Optionally the acoustic optic modulator (AOM) system further comprises a second acoustic optic modulator (AOM) located in series with the first acoustic optic modulator (AOM). Preferably the acoustic optic modulator (AOM) electrical circuit is employed to generate an input drive signal for the second AOM.

Preferably the distributed control system (DCS) is electrically connected to the second AOM by a second variable gain amplifier (VGA). Preferably, an electrical output from the second VGA is controlled by a second digitally controlled switch.

Optionally the distributed control system (DCS) further comprises a second digital output source employed to provide a control signal to open and close the second digitally controlled switch. Most preferably the distributed control system (DCS) further comprises a third direct digital synthesiser (DDS) employed to generate a frequency source for the second AOM e.g. a low frequency source at 80 MHz.

Most preferably the second VGA provides a means for converting the frequency source for the second AOM into an electrical signal comprising one or more pulses. Preferably the second VGA provides a means for setting the power level of the one or more pulses. It may also provide a means for determining the timing, shape and or width of the one or more pulses. Preferably the second digitally controlled switch provides a means for increasing the on/off extinction of the pulses. It may also provide a means for increased control for the timing and width of the pulses within the electrical signal.

In this embodiment, it is the combined effects of the driven first and second AOMs that impart the profile of the series of electrical pulses onto both components of the second component of the combined continuous-wave field to produce the desired pulsed output field. Employing two AOMs has the advantage that the AOM system exhibits higher levels of extinction between the pulses of the generated pulsed output field. In addition, such acoustic optic modulator systems offer greater flexibility of operation. For example, the first driven AOM may be employed primarily to produce pulse shaping while the second driven AOM may be employed to determine the power of each of the pulses of the generated pulsed output field.

Preferably a third digital output is arranged to trigger the second reference signal generator to generate a second reference signal with a predetermined frequency chirp. This arrangement enables a predetermined frequency chirp to be introduced throughout the pulse sequence of the second optical field.

Most preferably the third digital output is generated by the distributed control system (DCS). Generating the digital output on the distributed control system (DCS) improves the ability to synchronise the timing of the frequency chirps with the timing of individual pulses of the generated pulsed output field.

Preferably the laser system further comprises an analogue output source arranged to provide an analogue control signal to the analogue phase shifter wherein the analogue control signal provides a means for the analogue phase shifter to introduce a predetermined phase offset to the electrical beat signal. This arrangement enables a predetermined phase shift to be introduced between the first and second optical field components of the generated pulsed output field.

Most preferably the analogue output source is located on the distributed control system (DCS). Locating the analogue output source on the distributed control system (DCS) improves the ability to control the timing of the phase shifts with the timing of individual pulses of the generated pulsed output field.

Optionally the acoustic optic modulator (AOM) system further comprises a third acoustic optic modulator (AOM) located in series with the first acoustic optic modulator (AOM) and in parallel with the second acoustic optic modulator (AOM). Preferably the acoustic optic modulator (AOM) electrical circuit is employed to generate an input drive signal for the third AOM.

Optionally the acoustic optic modulator (AOM) system further comprises a fourth acoustic optic modulator (AOM) located in series with the first acoustic optic modulator (AOM) and in parallel with the second and third acoustic optic modulators (AOM). Preferably the acoustic optic modulator (AOM) electrical circuit is employed to generate an input drive signal for the fourth AOM.

The acoustic optic modulator system provides a means for splitting the generated pulsed output field into three distinct outputs, each of the three outputs being controlled by a combination of two of the AOMs. As a result, three outputs addressing three orthogonal axes (X, Y, Z) can be generated from the laser system which finds particular application within atomic interferometry.

Optionally the laser system further comprises an optical fibre into which the generated output field is coupled. The optical fibre provides a means for propagating the output field of the laser system to a required destination.

Optionally the laser system further comprises a power output monitor having a first photodetector arranged to monitor a power of the output field from the laser system. Optionally, the power output monitor further comprises a second photodetector arranged to monitor the power of the output field following propagation through the optical fibre. Optionally the power output monitor further comprises a third photodetector arranged to monitor the power of a return field to the laser system from the required destination. As a result, the second and third photodetectors provide a means for monitoring the power of the output field at a destination where the output field is intended to be deployed e.g. at the distal end of the optical fibre.

Optionally the laser system further comprises a third power feedback loop comprising the first photodetector arranged to provide feedback from the output field of the laser system to the acoustic optic modulator system. Preferably the laser system further comprises a fourth power feedback loop comprising the second photodetector arranged to provide feedback from the output field of the laser system after propagation though the fibre to the acoustic optic modulator system. Preferably the laser system further comprises a fifth power feedback loop comprising the third photodetector arranged to provide feedback from the return field of the laser system to the acoustic optic modulator system. The third, fourth and fifth feedback loops provide a means for automatically adjusting the laser system, as required. This can be achieved by employing the feedback loops to vary the amplitude of the electrical pulse signal employed to drive the first acoustic optic modulator and or the second acoustic optic modulator. This can be achieved by arranging for the feedback signals to be received by an analogue input on the DCS following which it is digitised. It is these digitised signals that provide the means for employing a feedback loop to vary the amplitude of the electrical pulse signal employed to drive the first acousto-optic modulator and or the second acousto-optic modulator. Alternatively, the feedback loops may be employed to adjust the alignment between the output field of the laser system and the optical fibre.

Most preferably the first and second continuous-wave laser sources each comprise a solid-state laser source. In particular, the first and second continuous-wave laser sources may each comprise a Ti:sapphire laser.

According to a second aspect of the present invention there is provided a method of configuring a laser system comprising a first continuous-wave optical field having a first operating frequency and a second continuous-wave optical field having a second operating frequency, the method comprising:

setting the second operating frequency to a first predetermined offset frequency from the first operating frequency;

combining the first and second optical fields to produce a combined continuous-wave optical field;

generating a first optical beat signal from at least a first component of the combined optical field;

converting the first optical beat signal to a first electrical beat signal;

generating a first reference signal at a second predetermined offset frequency from the first operating frequency;

generating a second reference signal at a frequency lower than the second predetermined offset frequency;

generating a first error signal from the electrical beat signal, the first reference signal and the second reference signal;

employing the first error signal to control a feedback signal for the second continuous-wave laser source to phase-lock the second operating frequency to the first operating frequency.

Most preferably the second predetermined offset frequency is of a same order of magnitude as the first predetermined offset frequency e.g. GHz. Preferably, the frequency of the second reference signal is one or more orders of magnitude lower than the frequency of the first reference signal e.g. MHz.

Preferably, the second predetermined offset frequency equals the first predetermined offset frequency plus or minus the frequency of the second reference signal.

Most preferably generating the first error signal comprises generating a first mixed down output signal from the first electrical beat signal and the first reference signal. In a similar manner, generating the first error signal further comprises generating a second mixed down output signal from the first mixed down output signal and the second reference signal.

Optionally, the first electrical beat signal is divided before being mixed with the first reference signal.

Optionally, the first reference signal is divided before being mixed with the first electrical beat signal.

Optionally, the first mixed down output signal is low pass filtered before being mixed with the second reference signal.

Optionally the method further comprises compensating for any relative phase noise introduced between the first and second optical fields due to the first and second optical fields not propagating along a common pathway.

Preferably compensating for any relative phase noise comprises generating a second optical beat signal from a second combined continuous-wave optical field. Most preferably the first and second continuous-wave optical fields are frequency doubled before being combined to form the second combined continuous-wave optical field.

Preferably compensating for any relative phase noise further comprises converting the second optical beat signal into a second electrical beat signal.

Preferably compensating for any relative phase noise further comprises generating a third reference signal at a third predetermined offset frequency from the first operating frequency.

Most preferably compensating for any relative phase noise further comprises generating a second error signal from the second electrical beat signal and the third reference signal. Preferably generating the second error signal comprises mixing down the second electrical beat signal and the third reference signal.

Most preferably compensating for any relative phase noise further comprises employing the second error signal to control a feedback signal to the first reference signal.

Most preferably, the method further comprises employing a component of the first optical field to maintain the first operating frequency at a predetermined offset frequency from an atomic transition.

Preferably maintaining the first operating frequency comprises optically modulating the component of the first optical field at the predetermined offset frequency from the atomic transition to provide a frequency sideband of the modulated component of the first optical field that is in resonance with the atomic transition.

Preferably maintaining the first operating frequency further comprises monitoring the transmission of the modulated component of the first optical field through an atomic vapour cell.

Preferably maintaining the first operating frequency further comprises generating an electrical feedback signal from the monitored transmission.

Maintaining the first operating frequency may further comprise employing the electrical feedback signal to control one or more tuning elements of the first continuous-wave laser source to maintain the first operating frequency.

The method may further comprise monitoring the power of the first continuous-wave optical field. Optionally, the monitored power may be employed to provide feedback signal to a pump source of the first continuous-wave optical field. The feedback signal may be employed to adjust the power of the pump source of the first continuous-wave optical field. Alternatively, the feedback signal may be employed to adjust the alignment of the pump source of the first continuous-wave optical field.

The method may further comprise monitoring the power of the second continuous-wave optical field. Optionally, the monitored power may be employed to provide feedback signal to a pump source of the second continuous-wave optical field. The feedback signal may be employed to adjust the power of the pump source of the second continuous-wave optical field. Alternatively, the feedback signal may be employed to adjust the alignment of the pump source of the second continuous-wave optical field.

Most preferably the method further comprises generating a series of optical pulses by passing a second component of the combined continuous-wave optical field through an acoustic optic modulator system.

Preferably the series of pulses is generated from a first acoustic optic modulator driven by a first frequency source. Preferably a first variable gain amplifier is employed as a means for converting the first frequency source into a first electrical signal comprising one or more pulses. Preferably the first variable gain amplifier is employed as a means for determining the timing, shape and or width of the one or more pulses.

Optionally the series of pulses is generated from a second acoustic optic modulator located in series with the first acoustic optic modulator and driven by a second frequency source. Preferably a second variable gain amplifier is employed as a means for converting the second frequency source into a second electrical signal comprising one or more pulses. Preferably the second variable gain amplifier is employed as a means for setting the power level of the one or more pulses. It may also provide a means determining the timing, shape and or width of the one or more pulses.

Optionally the series of pulses is generated from a third acoustic optic modulator located in series with the first acoustic optic modulator and in parallel with the second acoustic optic modulator and driven by a third frequency source.

Optionally the series of pulses is generated from a fourth acoustic optic modulator located in series with the first acoustic optic modulator and in parallel with the second and third acoustic optic modulators and driven by a fourth frequency source.

Preferably the method further comprises employing a digital control signal to trigger a predetermined frequency chirp to the second reference signal. This arrangement enables a predetermined frequency chirp to be introduced throughout the pulse sequence of the second optical field.

Preferably the method further comprises employing an analogue control signal to introduce a predetermined phase offset to the electrical beat signal. This arrangement enables a predetermined phase shift to be introduced between the first and second optical field components of the generated pulsed output field.

The method may further comprise coupling the output field of the laser system into an optical fibre.

The method may further comprise monitoring the power of the output field from the laser system. Optionally, the monitored power of the output field may be employed to provide a feedback signal for the laser system. The feedback signal may be employed to vary a power of the electrical signal applied to the first acoustic optic modulator. Alternatively, the feedback signal may be employed to adjust the alignment of the output field from the laser system and the optical fibre.

Optionally the method may further comprise monitoring the power of the output field at a destination where the output field is intended to be deployed. Optionally, the monitored power of the output field may be employed to provide a feedback signal for the laser system. The feedback signal may be employed to vary a power of the electrical signal applied to the first acoustic optic modulator. Alternatively, the feedback signal may be employed to adjust the alignment of the output field from the laser system and the optical fibre. Alternatively, the feedback signal may be employed to adjust the phase of the first reference signal.

Embodiments of the second aspect of the present invention may comprise features to implement the preferred or optional features of the first aspect of the present invention or vice versa.

According to a third aspect of the present invention there is provided a phase locking feedback loop for phase locking a first continuous-wave laser source that provides a first optical field at a first operating frequency and a second continuous-wave laser source that provides a second optical field at a first predetermined offset frequency from the first operating frequency; the phase locking feedback loop comprising a first optical beam combiner that provides a means for combining the first and second optical fields to produce a first combined continuous-wave optical field having a first optical beat signal;

a first optical beat detector that provides a means for converting the first optical beat signal to a first electrical beat signal;

a first reference signal generator that provides a means for generating a first reference signal at a second predetermined offset frequency from the first operating frequency;

a second reference signal generator that provides a means for generating a second reference signal at a frequency lower than the second predetermined offset frequency; and a phase-lock feedback loop electrical circuit that provides a means for generating a first error signal from the first electrical beat signal, the first reference signal and the second reference signal, the first error signal being employed to control a feedback signal for the second continuous-wave laser source.

Preferably the phase-lock feedback loop comprises a first analogue phase shifter located between the first optical beat detector and the phase-lock feedback loop electrical circuit. This arrangement enables a relative predetermined phase shift to be introduced to between the first and second optical fields.

Preferably the phase locking feedback loop further comprises a digital output arranged to trigger the second reference signal generator to generate a second reference signal with a predetermined frequency chirp. This arrangement enables a predetermined frequency chirp to be introduced throughout the pulse sequence of the second optical field.

Optionally the phase locking feedback loop further comprises a phase noise monitor that provides a means for compensating for any relative phase noise introduced between the first and second optical fields due to the first and second optical fields not propagating along a common pathway.

Preferably the phase noise monitor is arranged to receive a second optical beat signal produced by a second combined continuous-wave optical field.

Most preferably the phase noise monitor comprises a second optical beat detector that provides a means for converting the second optical beat signal to a second electrical beat signal.

Most preferably the phase noise monitor further comprises a third reference signal generator that provides a means for generating a third reference signal at a third predetermined offset frequency from the first operating frequency.

Most preferably the phase-lock feedback loop electrical circuit comprises a third frequency mixer wherein the third frequency provides a means for generating a second error signal by mixing down the second electrical beat signal and the third reference signal.

Preferably the second error signal is employed to control a feedback signal for adjusting a phase of the first reference signal generated by the first reference signal generator.

Embodiments of the third aspect of the present invention may comprise features to implement the preferred or optional features of the first or second aspects of the present invention or vice versa.

According to a fourth aspect of the present invention there is provided a method of phase locking a first continuous-wave optical field having a first operating frequency and a second continuous-wave optical field having a second operating frequency, the method comprising:

setting the second operating frequency to a first predetermined offset frequency from the first operating frequency;

combining the first and second optical fields to produce a first combined continuous-wave optical field;

generating a first optical beat signal from a first component of the first combined optical field;

converting the first optical beat signal to a first electrical beat signal;

generating a first reference signal at a second predetermined offset frequency from the first operating frequency;

generating a second reference signal at a frequency lower than the second predetermined offset frequency;

generating a first error signal from the first electrical beat signal, the first reference signal and the second reference signal;

employing the first error signal to control a feedback signal for the second continuous-wave laser source to phase-lock the second operating frequency to the first operating frequency.

Preferably the method further comprises employing a digital control signal to trigger a predetermined frequency chirp to the second reference signal. This arrangement enables a predetermined frequency chirp to be introduced throughout the pulse sequence of the second optical field.

Preferably the method further comprises employing an analogue control signal to introduce a predetermined phase offset to the electrical beat signal. This arrangement enables a predetermined phase shift to be introduced to individual pulses of the generated pulsed output field.

Optionally the method further comprises compensating for any relative phase noise introduced between the first and second optical fields due to the first and second optical fields not propagating along a common pathway.

Preferably compensating for any relative phase noise comprises generating a second optical beat signal from a second combined continuous-wave optical field.

Preferably compensating for any relative phase noise further comprises converting the second optical beat signal into a second electrical beat signal.

Preferably compensating for any relative phase noise further comprises generating a third reference signal at a third predetermined offset frequency from the first operating frequency.

Most preferably compensating for any relative phase noise further comprises generating a second error signal from the second electrical beat signal and the third reference signal. Preferably generating the second error signal comprises mixing down the second electrical beat signal and the third reference signal.

Most preferably compensating for any relative phase noise further comprises employing the second error signal to control a feedback signal to the first reference signal.

Embodiments of the fourth aspect of the present invention may comprise features to implement the preferred or optional features of the first to third aspects of the present invention or vice versa.

According to fifth aspect of the present invention there is a method of deploying the phase locking feedback loop of the third aspect of the present invention, the method comprising:

setting the first operating frequency of the first continuous-wave optical field to a first predetermined frequency;

setting the second operating frequency of the second continuous-wave optical field to the first predetermined frequency;

combining the first and second continuous-wave optical field to produce an optical beat signal;

monitoring a resonator voltage applied to one or more frequency tuning elements of the second continuous-wave laser source and the power output from an optical beat detector arranged to receive the optical beat signal while scanning the second operating frequency;

determining a resonator voltage corresponding to the second operating frequency equaling the first operating frequency;

setting the resonator voltage to the determined resonator voltage;

selecting a first predetermined frequency offset value for the second operating frequency relative to the first operating frequency;

apply a low gain feedback signal through the phase locking feedback loop;

apply an iterative control method to the resonator voltage to converge the resonator voltage towards an estimated value where the frequency offset between the first continuous-wave optical field and the second continuous-wave optical field corresponds with the first predetermined offset value;

once the convergence of the resonator voltage is within a desired tolerance level, setting the resonator voltage to the estimated value and apply a high gain feedback signal through the phase locking feedback loop.

Preferably a wavemeter is employed to set the first operating frequency of the first continuous-wave optical field. Similarly, a wavemeter may also be employed to set the second operating frequency of the second continuous-wave optical field.

Most preferably determining the resonator voltage corresponding to the second operating frequency being equal to the first operating frequency comprises determining the resonator voltage corresponding to the power output from an error amplifier of the optical beat detector falling to a minimum value e.g. zero.

Alternatively determining the resonator voltage corresponding to the second operating frequency being equal to the first operating frequency comprises determining the resonator voltage corresponding to the maximum value of a modulus of the differential of the power output from the error amplifier of the optical beat detector.

Most preferably the iterative control method comprises monitoring the output signal from a phase-frequency detector (PFD).

Optionally a first input to the phase-frequency detector (PFD) comprises a secondary beat signal generated by mixing down an electrical beat signal generated from the optical beat signal and a first reference signal generated by a frequency synthesiser. In this embodiment, a second input to the phase-frequency detector (PFD) comprises a second reference signal generated by a first Direct Digital Synthesiser (DDS).

Alternatively, a first input to the phase-frequency detector (PFD) comprises an electrical beat signal generated from the optical beat signal. In this embodiment, a second input to the phase-frequency detector (PFD) comprises a first reference signal generated by a frequency synthesiser. Both the first and second inputs to the phase-frequency detector (PFD) may be divided before arriving at the phase-frequency detector (PFD).

Preferably the iterative control method comprises scanning the second operating frequency of the second continuous-wave optical field to determining a first voltage (V1) and second voltage (V2) where the output signal from the phase-frequency detector (PFD) changes state.

Optionally the iterative control method comprises a bisection method applied to the output signal from the phase-frequency detector (PFD) to find the resonator voltage corresponding to the second operating frequency being at the first predetermined frequency offset value.

Alternatively, the iterative control method comprises directly measuring the beat frequency and comparing the directly measured beat frequency with the first predetermined frequency offset value.

Preferably applying a low feedback signal through the phase locking feedback loop comprises configuring a first amplifier to operate with a low gain value. The purpose of the low gain value is to enable phase-lock capture.

Preferably applying a high feedback signal through the phase locking feedback loop comprises configuring a first amplifier to operate with a high gain value. A high gain setting is required for noise reduction.

Embodiments of the fifth aspect of the present invention may comprise features to implement the preferred or optional features of the first to fourth aspects of the present invention or vice versa.

According to a sixth aspect of the present invention there is provided a frequency locking feedback loop for a continuous-wave laser source that provides an optical field at an operating frequency at a predetermined offset frequency from an atomic transition, the frequency locking feedback loop comprising an optical modulator wherein operation of the optical modulator provides a means for frequency modulating the optical field at the predetermined offset frequency from the atomic transition thereby providing a frequency sideband of the modulated component of the optical field that is in resonance with the atomic transition, an atomic saturation absorption spectroscopy module employed to monitor the transmission of the modulated component of the optical field through an atomic vapour cell, and a feedback loop electrical circuit that provides a means for generating an electrical feedback signal from an output of the atomic saturation absorption spectroscopy module.

Most preferably the electrical feedback signal is employed to control one or more tuning elements of the continuous-wave laser source to maintain the operating frequency.

Embodiments of the sixth aspect of the present invention may comprise features to implement the preferred or optional features of the first to fifth aspects of the present invention or vice versa.

According to a seventh aspect of the present invention there is provided a method for frequency locking a continuous-wave optical field with reference to an atomic transition, the method comprising:

selecting the operating frequency of the continuous-wave optical field to be at a predetermined offset frequency from the atomic transition, optically modulating the continuous-wave optical field at the predetermined offset frequency to introduce a frequency modulation on the continuous-wave optical field thereby providing a frequency sideband of the modulated component of the optical field that is in resonance with the atomic transition, monitoring the transmission of the frequency modulated component of the continuous-wave optical field through an atomic vapour comprising the atomic transition, and generating an electrical feedback signal from the monitored transmission.

Most preferably the method further comprises employing the electrical feedback signal to control one or more tuning elements of the first continuous-wave laser source to maintain the operating frequency of the continuous-wave optical field.

Embodiments of the seventh aspect of the present invention may comprise features to implement the preferred or optional features of the first to sixth aspects of the present invention or vice versa.

According to an eighth aspect of the present invention there is provided a pulse generator for generating a series of optical pulses form a continuous-wave optical field the pulse generator comprising an acoustic optic modulator (AOM) system comprising a first acoustic optic modulator (AOM) and an acoustic optic modulator (AOM) electrical circuit employed to generate a first frequency source for driving the first AOM wherein the acoustic optic modulator (AOM) electrical circuit comprises a distributed control system (DCS) that is electrically connected to the first AOM by a first variable gain amplifier (VGA).

Preferably, an electrical output from the first VGA is controlled by a first digitally controlled switch.

Optionally the distributed control system (DCS) further comprises a first digital output source employed to provide a control signal to open and close the first digitally controlled switch. Most preferably the distributed control system (DCS) further comprises a first direct digital synthesiser (DDS) employed to generate a frequency source for the first AOM.

Most preferably the first VGA provides a means for converting the frequency source for the first AOM into a first electrical signal comprising one or more pulses. Preferably the first VGA provides a means for determining the timing, shape and or width of the one or more pulses. Preferably the first digitally controlled switch provides a means for increasing the on/off extinction of the pulses. It may also provide a means for increased control for the timing and width of the pulses within the first electrical signal.

Optionally the acoustic optic modulator (AOM) system further comprises a second acoustic optic modulator (AOM) located in series with the first acoustic optic modulator (AOM). Preferably the acoustic optic modulator (AOM) electrical circuit is employed to generate an input drive signal for the second AOM.

Preferably the distributed control system (DCS) is electrically connected to the second AOM by a second variable gain amplifier (VGA). Preferably, an electrical output from the second VGA is controlled by a second digitally controlled switch.

Optionally the distributed control system (DCS) further comprises a second digital output source employed to provide a control signal to open and close the second digitally controlled switch. Most preferably the distributed control system (DCS) further comprises a second direct digital synthesiser (DDS) employed to generate a frequency source for the second AOM.

Most preferably the second VGA provides a means for converting the frequency source for the second AOM into an electrical signal comprising one or more pulses. Preferably the second VGA provides a means for setting the power level of the one or more pulses. It may also provide a means determining the timing, shape and or width of the one or more pulses. Preferably the second digitally controlled switch provides a means for increasing the on/off extinction of the pulses. It may also provide a means for increased control for the timing and width of the pulses within the electrical signal.

Optionally the acoustic optic modulator (AOM) system further comprises a third acoustic optic modulator (AOM) located in series with the first acoustic optic modulator (AOM) and in parallel with the second acoustic optic modulator (AOM). Preferably the acoustic optic modulator (AOM) electrical circuit is employed to generate an input drive signal for the second AOM.

Optionally the acoustic optic modulator (AOM) system further comprises a fourth acoustic optic modulator (AOM) located in series with the first acoustic optic modulator (AOM) and in parallel with the second and third acoustic optic modulators (AOM). Preferably the acoustic optic modulator (AOM) electrical circuit is employed to generate an input drive signal for the fourth AOM.

Embodiments of the eighth aspect of the present invention may comprise features to implement the preferred or optional features of the first to seventh aspects of the present invention or vice versa.

According to a ninth aspect of the present invention there is provided a method of generating a series of optical pulses form a continuous-wave optical field the method comprising passing the continuous-wave optical field through a first acoustic optic modulator (AOM) driven by a first frequency source, employing a first variable gain amplifier as means for converting the first frequency source into an electrical signal comprising one or more pulses.

Preferably the first variable gain amplifier is employed as a means for determining the timing, shape and or width of the one or more pulses.

Optionally the method further comprises employing first digital switch to provide a means for increasing the on/off extinction of the pulses. It may also provide a means for further determining the timing and or width of the one or more pulses.

Optionally the method further comprises passing the generated series of optical pulses through a second acoustic optic modulator located in series with the first acoustic optic modulator and driven by a second frequency source. Preferably a second variable gain amplifier is employed as a means for setting the power level of the one or more pulses. It may also provide a means converting the second frequency source into a second electrical signal comprising one or more pulses. Preferably a second variable gain amplifier is employed as a means for determining the timing, shape and or width of the one or more pulses.

Optionally the method further comprises passing the generated series of optical pulses through a third acoustic optic modulator located in series with the first acoustic optic modulator and in parallel with the second acoustic optic modulator and driven by a third frequency source.

Optionally the method further comprises passing the generated series of optical pulses through a fourth acoustic optic modulator located in series with the first acoustic optic modulator and in parallel with the second and third acoustic optic modulators and driven by a fourth frequency source.

Embodiments of the ninth aspect of the present invention may comprise features to implement the preferred or optional features of the first to eighth aspects of the present invention or vice versa.

BRIEF DESCRIPTION OF DRAWINGS

There will now be described, by way of example only, various embodiments of the invention with reference to the drawings, of which.

Figure 1:
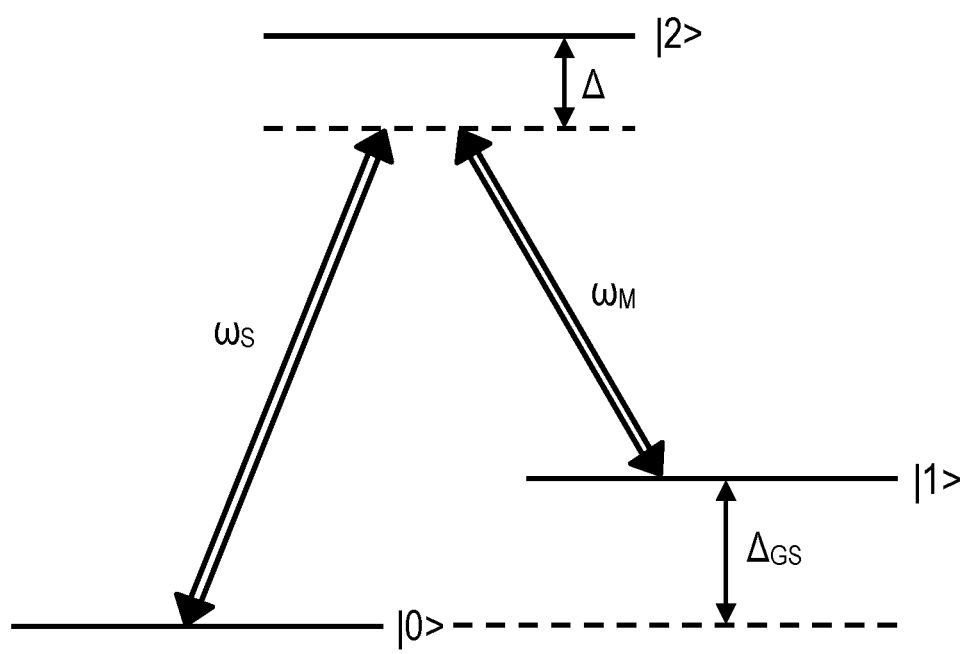
FIG. 1 presents a schematic representation of a stimulated Raman transition.

In the description which follows, like parts are marked throughout the specification and drawings with the same reference numerals. The drawings are not necessarily to scale and the proportions of certain parts have been exaggerated to better illustrate details and features of embodiments of the invention.

DETAILED DESCRIPTION

A laser system 1 in accordance with an embodiment of the present invention will now be described with reference to FIG. 2. Axes are included within FIG. 2 for ease of understanding of the following description.

The laser system 1 can be seen to comprise first 2 and second 3 Ti:sapphire lasers. Both of the Ti:sapphire lasers 2 and 3 are optically pumped at 532 nm by dedicated continuous wave diode-pumped solid-state (DPSS) laser sources 4 and 5 to produce first 6 and second 7 continuous-wave output fields that propagate parallel to the x-axis and which exhibit linear polarisation parallel to the y-axis. The applicant's proprietary SolsTiS® lasers are suitable examples of such Ti:sapphire lasers 2 and 3 while the pump lasers 4 and 5 may comprise commercially available diode-pumped solid-state (DPSS) lasers.

The first pump source 4 has the capability of providing up to 15 Watts of pump power to the first Ti:sapphire laser 2 while the second pump source 5 has the capability of providing up to 10 Watts of pump power to the second Ti:sapphire laser 3. For the purposes of the following discussion, the first pump source 4 is arranged to provide ~8.5 Watts of pump power to the first Ti:sapphire laser 2 to provide a tuneable first output field 6 (tuneable between 670 nm and 1050 nm) with a power of around 1 Watt at 780 nm. Similarly, the second pump source 5 is arranged to providing ~4.5 Watts of pump power to the second Ti:sapphire laser 3 to provide a tuneable second output field 7 (again tuneable between 670 nm and 1050 nm) with a power of around 0.5 Watts at 780 nm.

First 8 and second wavemeters 9 may by incorporated with a pick-off fields 10 and 11 produced by first and second beam splitters 12 and 13 located within the first 6 and the second 7 output fields, respectively, in order to provide a means for accurately measuring the wavelength, or frequency, of the first 6 and the second 7 output fields.

As will be appreciated by the skilled reader, the efficiency of the laser system 1 may vary over time and so it cannot be guaranteed that the above described pump powers will generate exactly the desired output powers from the Ti:sapphire lasers 2 and 3, Therefore, for improved operation at accurate output power settings, it is useful for a first power feedback loop 14, comprising a third beam splitter 15 and a first photodetector 16, to be arranged between the first output field 6 and the first pump source 4. For similar reasons, it is preferential for a second power feedback loop 17, comprising a fourth beam splitter 18 and a second photodetector 19 to be arranged between the second output field 7 and the second pump source 5. In this way, the power of the first 6 and second 7 output fields can be monitored via third 20 and fourth 21 pick-off fields, respectively, and automatically adjusted as required. This can be achieved by varying the power of first pump laser 4 or the second pump laser 5 and or by adjusting the alignment of the first pump laser 4 or the second pump laser 5 into the first Ti:sapphire laser 2 and or the second Ti:sapphire laser 3, respectively.

A first beam steering mirror 22 redirects the first output field 6 such that it now propagates along the y-axis onto a first polarising beam-splitting plate 23 via a first half-wave plate 24. The function of the first half-wave plate 24 is to rotate the polarisation of the first output field 6 such that it exhibits linear polarisation parallel to the z-axis when it arrives at the first polarising beam-splitting plate 23.

The first polarising beam-splitting plate 23 provides a means to combine the orthogonally, linearly, polarised first 6 and second output fields 7 to produce a first 25 and a second 26 combined continuous-wave fields for further processing by the laser system 1.

The first combined continuous-wave field 25 is directed to propagate parallel to the y-axis. As can be seen from FIG. 2, the first combined continuous-wave field 25 is arranged to propagate through a second half-wave plate 27 and a second polarising beam-splitting plate 28 before being incident upon an optical beat detector 29 that forms part of a phase-lock feedback loop 30 for the second Ti:sapphire laser 3, as described in further detail below. The function of the second half-wave plate 27 is to equalise the power of the two components of the first combined continuous-wave field 25 transmitted through the second polarising beam-splitting plate 28. The second polarising beam-splitting plate 28 then projects a portion of each of the two polarisations into a horizontal, transmitted polarisation component and a vertical, reflected, polarisation component. The horizontal, transmitted polarisation component then is incident upon the optical beat detector 29, while the vertical, reflected, polarisation component is simply absorbed by a beam dump (not shown).

By contrast, the second combined continuous-wave field 26 is directed to propagate parallel to the x-axis and comprises orthogonally, linearly, polarised components. As can be seen from FIG. 2, the second combined continuous-wave field 26 is incident upon an acoustic optic modulator (AOM) system 31. The AOM system 31 can be seen to comprise a first acoustic optic modulator (AOM) 32, an input drive signal 33 for which is generated by an AOM electrical circuit 34. As will be described in further detail below, the acoustic optic modulator system 31 provides a means for converting the second combined continuous-wave field 26 into a pulsed output field 35 for the laser system 1.

Within the presently described laser system 1, the first Ti:sapphire laser 2 is selected to function as the master laser (ML) while the second Ti:sapphire laser 3 is configured to function as the slave laser (SL). The apparatus and methodology for achieving this arrangement will now be described in detail.

Setting and Locking the Operating Frequency of the Master Laser

A frequency locking feedback loop 36 for the first Ti:sapphire laser 2 can be seen to comprise a fifth beam splitter 37 located within the first output field 6. The fifth beam splitter 37 provides a means for producing a fifth pick-off field 38 from the first output field 6 that is directed to propagate along the y-axis. The fifth pick-off field 38 propagates through an electro-optic modulator 39 before being incident upon a Rubidium vapour, saturation absorption spectroscopy module 40 (the applicant's proprietary SolsTiS® Vapour Cell Lock Option is a suitable example of such a module). An electrical output signal 41 generated by the Rubidium vapour, saturation absorption spectroscopy module 40 is connected to a piezo electric mounted mirror 42 that forms part of the resonator of the first Ti:sapphire laser 2 by a feedback loop electrical circuit 43.

Rubidium-87 ($^{87}$Rb) is one of two naturally occurring isotopes of Rubidium, the other being Rubidium-85 ($^{85}$Rb). Its specific characteristics and energy level structure make Rubidium an ideal atom for quantum and atom optics experiments. $^{87}$Rb is an alkali atom with one electron in the outermost 5S shell. The transition to the 5P excited state is split into two D-line components; the D1 line ($5^2S_{1/2} \rightarrow 5^2P_{1/2}$) and the D2 line ($5^2S_{1/2} \rightarrow 5^2P_{3/2}$). Of these two components, the latter is the one preferred to be employed within experimental atomic physics due to the fact that its cycling transition can be exploited for the cooling and trapping of $^{87}$Rb.

Figure 3:
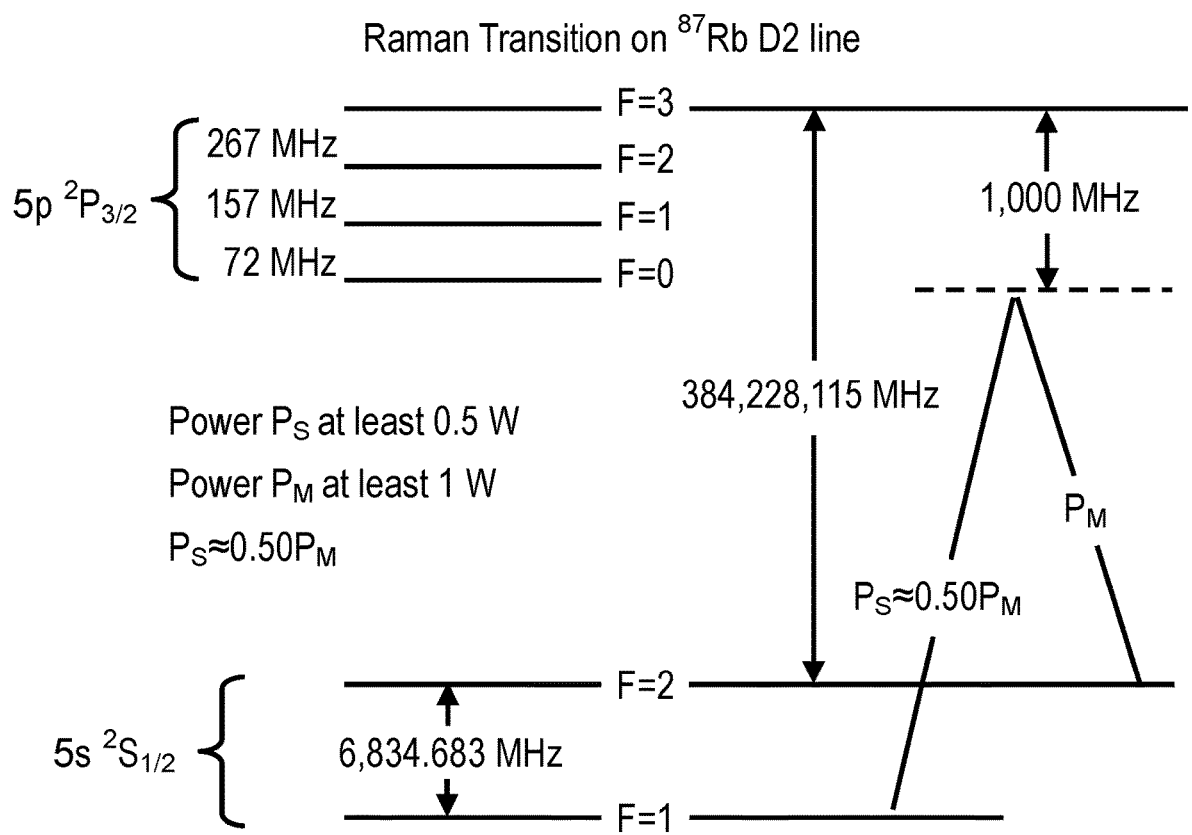
FIG. 3 presents a schematic representation of a stimulated Raman transition on the Rubidium-87 ($^{87}$Rb) D2 line.
Figure 4:
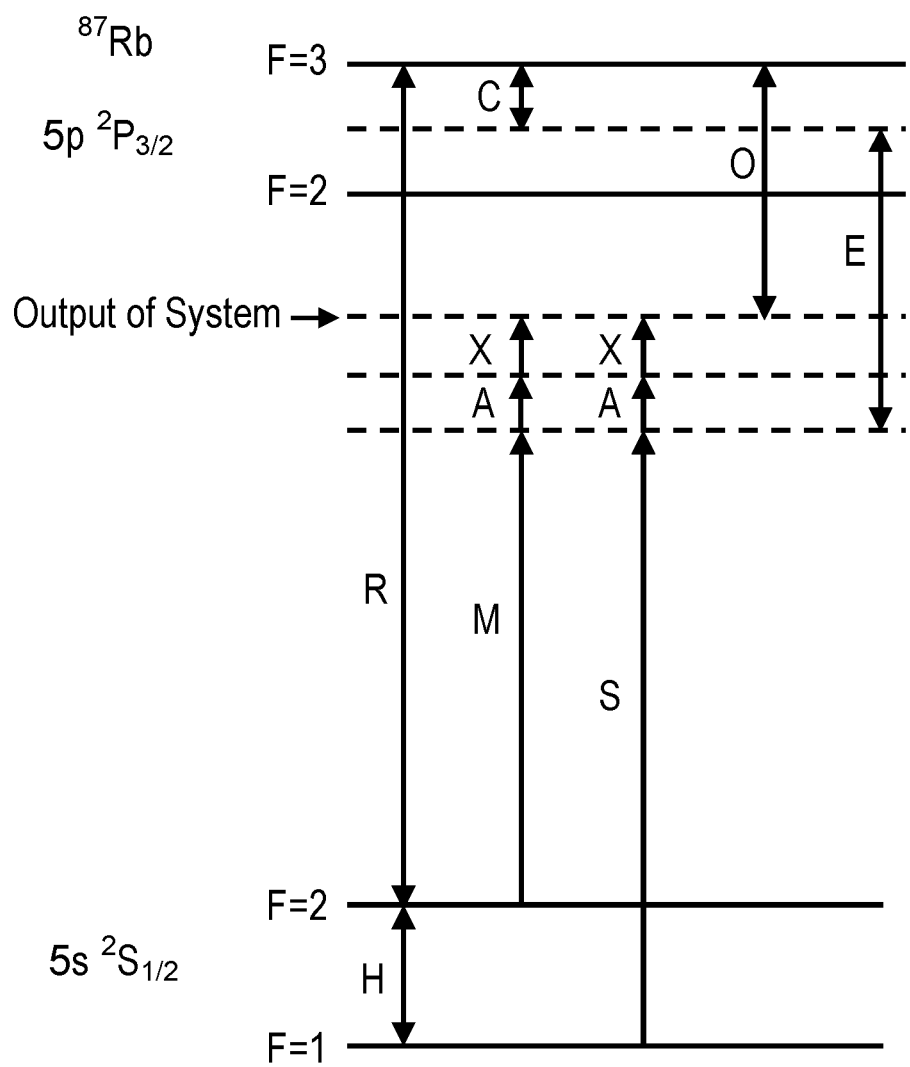
FIG. 4 presents a schematic representation of the laser frequencies, and offsets, when the laser system of FIG. 2 is configured to control the stimulated Raman transition on the Rubidium-87 ($^{87}$Rb) D2 line presented in FIG. 3.

FIG. 3 presents a schematic representation of the $^{87}$Rb D2 line with which the presently described laser system 1 has been employed to produce a stimulated Raman transition while FIG. 4 presents a schematic representation of the laser frequencies, and offsets generated by the various components of the laser system 1. Using the reference letters of FIG. 4, the relevant frequency values are provided within Table 1 below:

TABLE 1

| Frequency | Label | Value (MHz) |
|---|---|---|
| $5^2S_{1/2}$ (F = 2) to $5^2P_{3/2}$ (F = 3) | R | 384,228,115 |
| Offset of System from $5^2S_{1/2}$ (F = 2) to $5^2P_{3/2}$ (F = 3) | O | 840 |
| $5^2S_{1/2}$ (F = 1) to $5^2S_{1/2}$ (F = 2) | H | 6,834.683 |
| Offset of $5^2S_{1/2}$ (F = 2) to $5^2P_{3/2}$ (F = 2, 3 crossover point) from $5^2S_{1/2}$ (F = 2) to $5^2P_{3/2}$ (F = 3) | C | 133 |
| EOM | E | 867 |
| First AOM | A | 80 |
| Second AOM | X | 80 |
| Master Laser | M | 384,227,115 |
| Slave Laser | S | 384,233,950 |

As can be seen from FIG. 3, the F=1 and the F=2 hyperfine states of the $5^2S_{1/2}$ state are split by 6,834.683 MHz while the F=0, 1, 2, and 3 hyperfine states of the $5^2P_{3/2}$ state are split by 72 MHz, 157 MHz and 267 MHz, respectively. The frequency separation between the $5^2S_{1/2}$ (F=2) hyperfine state and $5^2P_{3/2}$ (F=3) hyperfine state is 384,228,115 MHz, or in wavelength terms approximately 780 nm.

The first Ti:sapphire laser 2 is frequency locked to the crossover transition between the $5^2S_{1/2}$ (F=2) hyperfine state and $5^2P_{3/2}$ (F=2 to 3) hyperfine state of the $^{87}$Rb D2 line in the following manner. In the first instance, the first output field 6 is configured to have a frequency of 384,227,115 MHz. This means the first output field 6 is detuned by $\Delta$=1,000 MHz from the $5^2S_{1/2}$ (F=2) to $5^2P_{3/2}$ (F=3) transition of the $^{87}$Rb D2 line thus avoiding the first Ti:sapphire laser 2 driving population into the available hyperfine states (F=1, 2 or 3) of the $5^2P_{3/2}$ state.

The electro-optic modulator 39 is then driven with a modulated frequency of 867 MHz to introduce a corresponding frequency modulation on the first output field 6. As will be appreciated by the skilled reader, the electro-optic modulator 39 effectively introduces frequency sidebands at ±867 MHz relative to the central operating frequency of 384,227,115 MHz of the first output field 6. As will be further appreciated, this modulation level is such that the highest frequency component of the modulated first output field 6 has a frequency which corresponds to the crossover point between the $5^2S_{1/2}$ (F=2) hyperfine state and $5^2P_{3/2}$ (F=2 to 3) hyperfine state of the $^{87}$Rb D2 line. The rubidium vapour, saturation absorption spectroscopy module 40, in combination with the feedback loop electrical circuit 43, is then employed to generate an electrical feedback signal to the piezo electric mounted mirror 42 that forms part of the resonator of the first Ti:sapphire laser 2 to maintain the operating frequency of the first output field 6 at 384,227,115 MHz. In this way, the first output field 6 is referenced to an atomic transition of the $^{87}$Rb D2 line, without being in resonance with this atomic transition, thus avoiding driving population into the upper state. It will be appreciated by the skilled reader that the first Ti:sapphire laser 2 could alternatively be locked to the frequencies corresponding to any of the crossover transitions between the $5^2S_{1/2}$ (F=2) hyperfine state and the $5^2P_{3/2}$ (F=1, 2 or 3) hyperfine states, or indeed to the frequencies of transitions themselves, by adjusting the modulating frequency at which the electro-optic modulator 39 is driven to an appropriate modulation frequency to introduce the desired frequency modulation upon the first output field 6. Alternatively, or in combination the operating frequency of the first output field 6 may also be varied.

The above method of locking the operating frequency to an atomic transition is not limited to the use of a Ti:sapphire laser 2 source or the use of Rubidium. For example, Calcium, Caesium or Potassium may be employed as an alternative atomic vapour.

The described laser system 1 may be configured to automatically set and lock the operating frequency of the first Ti:sapphire laser 2. This is achieved via a graphic user interface (GUI) incorporated within the frequency locking feedback loop 36. From the GUI a repeated scan of the resonator voltage of the first Ti:sapphire laser 2 is initiated and the frequency of the first output field 6 or centre value of the resonator scan is tuned so that the scan covers the spectral region corresponding to the atomic transition to which the first Ti:sapphire laser 2 is to be offset locked. In the above described embodiment, the frequency sideband of the modulated component of the first output field 6 is resonant or close to being resonant with the desired Rubidium atomic transition. The GUI then displays the transmission of the atomic vapour cell 40 as a function of the resonator voltage. In the region of the desired atomic transition, a number of peaks are apparent corresponding to the various components of the Rubidium atomic transition. To lock to the required peak, a cursor of the GUI is placed at the peak to which the first Ti:sapphire laser 2 is to be offset locked. On clicking the mouse at that point, control software for the frequency locking feedback loop 36 causes the first Ti:sapphire laser 2 to automatically offset lock to the desired peak i.e. the software tunes the resonator to the voltage corresponding to the peak of the component of the atomic transition and the feedback loop or lock is engaged.

It will be further appreciated by the skilled reader that as an alternative to locking the first Ti:sapphire laser 2 to an atomic transition, the first Ti:sapphire laser 2 could be locked to an alternative reference known in the art. This could also be a reference cavity, in which case the first Ti:sapphire laser 2 would be locked to a resonance of the cavity.

Phase-Locking the Slave Laser (SL) to the Master Laser (ML)

Figure 5:
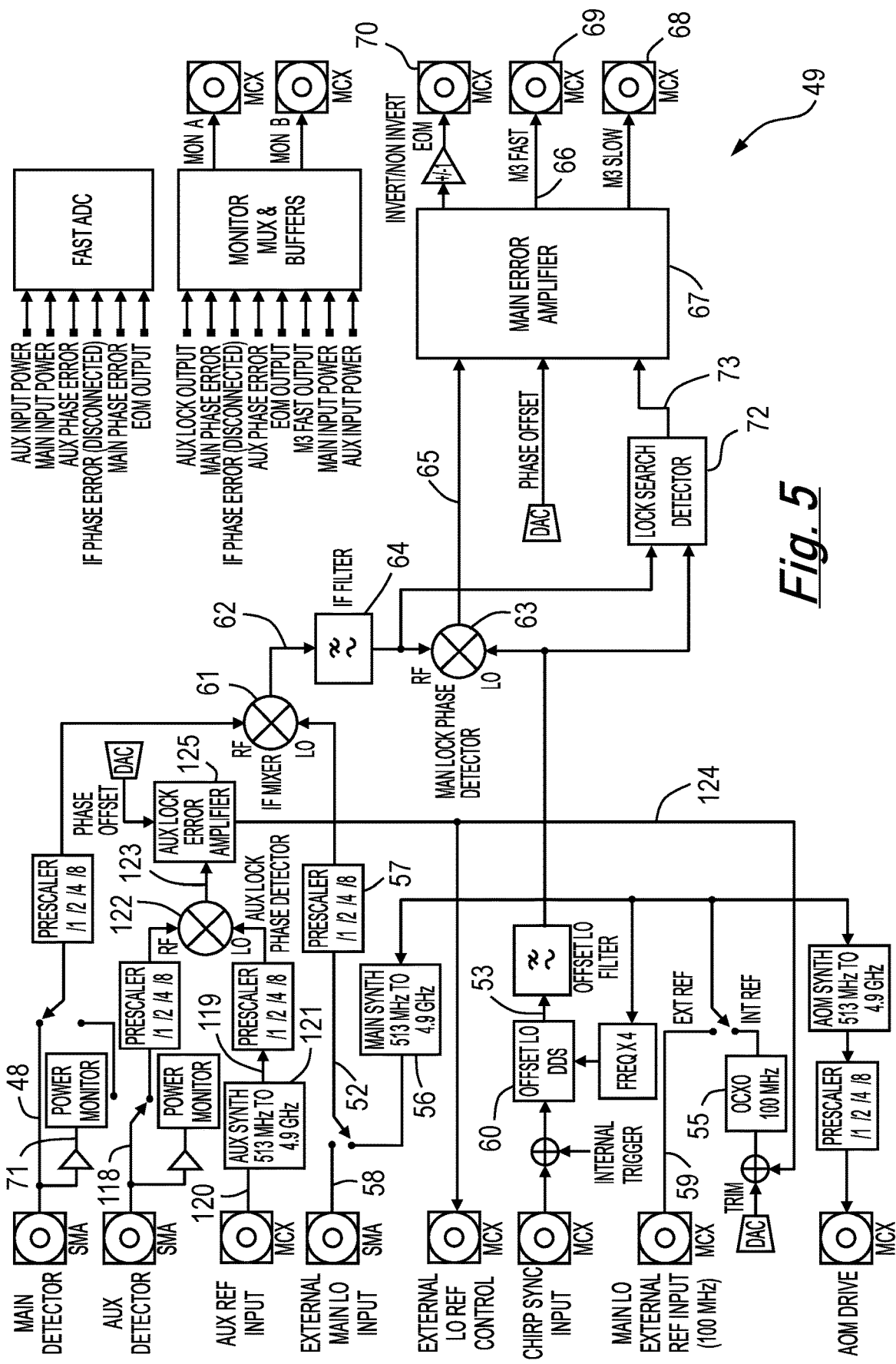
FIG. 5 presents an electric circuit of a phase-locked feedback loop of the laser system of FIG. 2.

Further details of the components comprising the phase-lock feedback loop 30 for phase-locking the second Ti:sapphire laser 3 to the first Ti:sapphire laser 2 will now be described with reference to FIG. 2 and FIG. 5. In particular, FIG. 5 presents an electric circuit of the phase-locking feedback loop 30 of the laser system of FIG. 2.

The first stage of the phase locking process is to configure the second Ti:sapphire laser 3 to generate the second output field 7, for example at a frequency of 384,233,950 MHz. In the presently described embodiment, this means that the second output field 7 has a frequency of 6,835 MHz greater than the first output field 6 generated by the first Ti:sapphire laser 2, which corresponds to the frequency separation between the F=1 and F=2 hyperfine states of the $5^2S_{1/2}$ state of $^{87}$Rb, while rendering the second output field 7 detuned by $\Delta$=733 MHz from the $5^2S_{1/2}$ (F=1) to $5^2P_{3/2}$ (F=2) hyperfine states of the $^{87}$Rb D2 line. As a result, the second Ti:sapphire laser 3 is prevented from driving population into the available transition hyperfine states (F=0, 1 or 2) of the $5^2P_{3/2}$ state.

As will be appreciated by the skilled reader, the above arrangement results in the first combined continuous-wave field 25 generating an optical beat signal 44 at the frequency difference between the first output field 6 and the second output field 7, namely 6,835 MHz. The phase-lock feedback loop 30 operates by monitoring this optical beat signal 44. This is achieved by employing the optical beat detector 29, which comprises a third photodetector 45 and a first amplifier 46, to convert the optical beat signal 44 into an electrical beat signal 47.

The first combined continuous-wave field 25 may be arranged to propagate through a single mode fibre following propagation through the second polarising beam splitting plate 28. This ensures that the components of the first combined continuous-wave field 25 are perfectly overlapped spatially and, with careful balancing of powers, also ensures maximum contrast within the optical beat signal 44 i.e. close to 100% amplitude modulation. The first combined continuous-wave field 25 may then be transmitted to a remote fibre-coupled detector which is in close proximity to the electronics, specifically the first optical beat detector 29. This arrangement offers the advantage that the path length of high frequency (microwave) electrical beat signal 47. is kept to a minimum, avoiding unnecessary losses and the opportunity to pick up stray airborne radio/microwave signals ("pick-up"). Conversely, the path length of optical transmission may be long without incurring any penalty: losses are very small and there is no equivalent of pick-up The electrical beat signal 47 is employed to provide a first input signal 48 to a phase-lock feedback loop electrical circuit 49. Optionally the electrical beat signal 47 is passed through an analogue phase shifter 50 before arriving at the phase-lock feedback loop electrical circuit 49. Further details of the function of the analogue phase shifter 50 are provided in the "Phase Shift Control" section below. In addition, the electrical beat signal 47 may also be scaled before arriving at the phase-lock feedback loop electrical circuit 49. In the presently described embodiment the electrical beat signal 47 is passed through a first electrical divider 51 that provides a means for dividing (e.g. halving) the frequency of the electrical beat signal 47 i.e. the first input signal 48 to the phase-lock feedback loop electrical circuit 49 has a frequency of around 3,417 MHz.

Two reference signals 52 and 53 are preferably generated within the phase-lock feedback loop electrical circuit 49.

The first reference signal 52 is preferably generated by a first local oscillator 54 at the scaled offset frequency between the second output field 7 and the first output field 6 plus or minus the frequency of the second reference signal 53 i.e. ~3,400 MHz. The first local oscillator 54 comprises an Oven Controlled Crystal Oscillator (OCXO) 55, operating at 100 MHz, connected to a frequency synthesiser 56 configured to multiply the output of the OCXO 55 by a factor of thirty-four. This arrangement results in the first reference signal 52 exhibiting extremely low noise at the 3,400 MHz operating frequency. It will be appreciated by the skilled reader that the frequency synthesiser 56 may be employed to scale the 100 MHz output signal of the OCXO 55 by different amounts thus making the phase-locking feedback loop 30 highly tunable. In addition, a second electrical divider 57 may also be incorporated within the first local oscillator 54 in order to provide this component with increased flexibility regarding the operating frequency of the first reference signal 52.

In an alternative embodiment, a first external input signal 58 may be employed as the first reference signal 52.

In an alternative embodiment, a second external input signal 59 at 100 MHz may be employed instead of the OCXO 55 as the reference input to the frequency synthesiser 56.

The second reference signal 53 is preferably generated by a second local oscillator 60 at a frequency several orders of magnitude lower than first reference signal 52 i.e. between 10 to 150 MHz. The second local oscillator 60 comprises a first Direct Digital Synthesiser (DDS) thus rendering the generated second reference signal 53 is being extremely agile at the operating frequency i.e. between 10 to 150 MHz. The noise of the second reference signal 53 is additive, however, since it is orders of magnitude lower than the first reference signal 52, the noise it adds is small relative to that of the output of the frequency synthesiser 56. The particular architecture (high frequency, low noise first reference signal 52 combined with low frequency, agile second reference signal 53) introduces agility to the system 1 without compromising noise performance.

The first input signal 48 and the first reference signal 52 are then supplied to a first frequency mixer 61 located on the phase-lock feedback loop electrical circuit 49. The first frequency mixer 61 is employed to mix down the first input signal 48 and the first reference signal 52 to provide a secondary beat signal 62.

The secondary beat signal 62 is then supplied to a second frequency mixer 63 located on the phase-lock feedback loop electrical circuit 49 via a low pass frequency filter 64. The second reference signal 53 is also supplied to the second frequency mixer 63. The second frequency mixer 63 is employed to mix down the secondary beat signal 62 and the second reference signal 53 to provide an output error signal 65.

Figure 6:
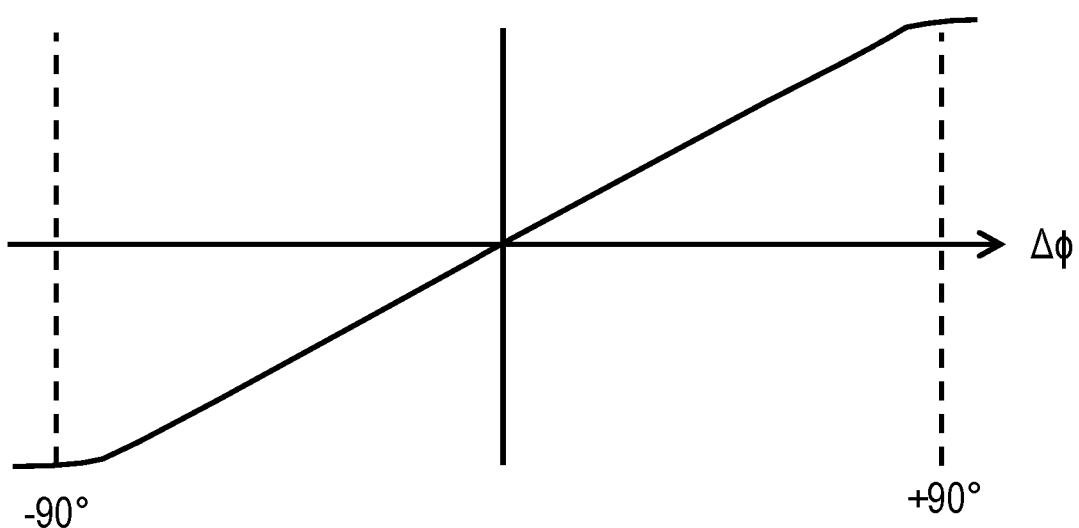
FIG. 6 presents a graph showing an error signal generated by phase-locked feedback loop as a function of a frequency of an output field from a second Ti:sapphire laser of the laser system of FIG. 2.

The output error signal 65 is then employed to control a feedback signal 66 to the second Ti:sapphire laser 3 via an error amplifier 67. In practice, if the frequency of the second output field 7 drifts from the desired operating frequency of 384,233,950 MHz then the output error signal 65 deviates from the 0 volts position, as presented in FIG. 6. By employing the output error signal 65 to control the feedback signal 66 to one or more tuning elements of the second Ti:sapphire laser 3, namely a slow piezo-electric crystal 68 and a fast piezo-electric crystal 69 upon which one of the laser cavity mirrors is mounted, and an intracavity electro-optic modulator 70, then the output error signal 65 can be minimised resulting in the second output field 7 being accurately phase-locked at a 6.834 GHz frequency difference with the first output field 6. This phase locking of the second output field 7 to the first output field remains even if the operating frequency of the first output field 6 drifts i.e. the frequency lock on the first output field 6 drops out.

In order to tune the second Ti:sapphire laser 3 to a specific offset frequency, for example, 6,834.683 MHz coarse frequency tuning is handled by setting the first reference signal 52 while fine tuning is handled by setting the frequency of the second reference signal 53 i.e. by the first DDS 60. Rather than operating at exactly 100 MHz, the first DDS 60 can be set to operate at any frequency between 10 MHz and 150 MHz. Thus, for example, to achieve the frequency 6,834.683 MHz, the following frequencies are applied:

First Input Signal (beat) 47: 6,834.683 MHz
First Electrical Divider:51 2
First Reference Signal 52: 3,400 MHz
Second Electrical Divider 57: 1
Second Reference Signal 53: 17.3415 MHz The above described frequency locking feedback loop 36 is found to introduce a relative phase noise (typically <15 mrad) between the first output field 6 and the second output field 7 at the specific operating frequencies. The high level of low frequency gain in the error amplifier 67 conditions suppresses this to a large extent.

At 25 ms averaging time, the Allan deviation of phase noise in the pulsed output field 35b of the laser system 1 is found to be less than 15 mrad, when the offset frequency is set to 6.834 GHz.

The laser system 1 provides significantly improved relative noise levels between the phase-locked laser sources 2 and 3 when compared with those systems known in the art. The applicants have found that the level of phase noise typically achieved is <15 mrad at 25 ms. However, it is believed that this value is not the ultimate limit of the laser system 1. It is known that 15 mrad corresponds exactly to the noise floor of the first local oscillator 54 and in particular the OCXO 55 from which the first reference signal 52 is synthesised, By employing a different microwave synthesiser within the first local oscillator 54 (such as the Spectra Dynamics RB1), or a state-of-the art 100 MHz reference as the source for the internal synthesizer, measurements infer that a relative phase-noise at the 1 mrad-level is achievable. This reflects the intrinsic noise floor of the system excluding the OCXO 55. Such performance can be attributed to exemplary RF electronic design: functional/schematic design, board layout, selection of components. In combination, these are capable of delivering sub-mrad-level performance when combined with a state-of-the art reference source.

Automated Phase Locking

Figure 7A:
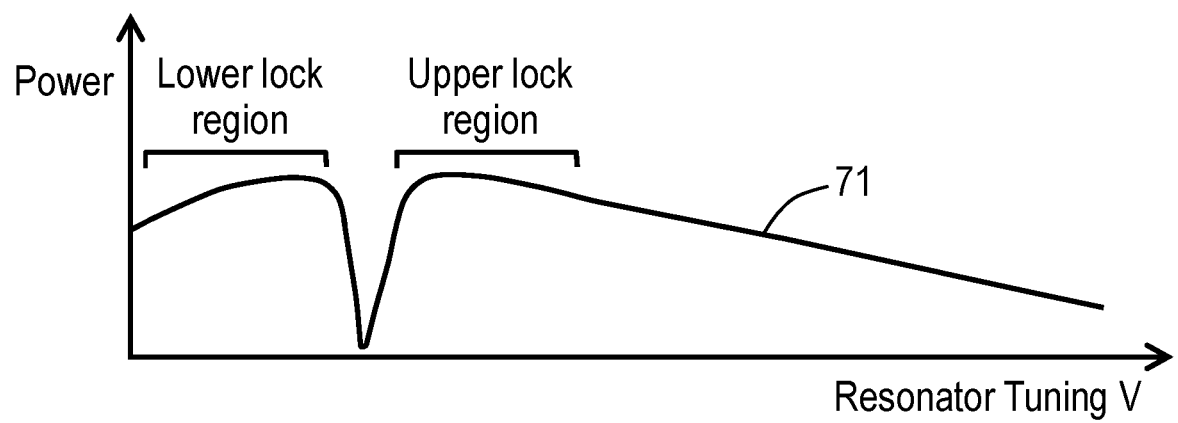
FIG. 7 presents a graph showing:
(a) an output power signal; and
(b) a derivative of the output signal,
produced by a photodetector and amplifier of the phase-locked feedback loop as a function of the voltage applied to one or more frequency tuning elements of the second Ti:sapphire laser of the laser system of FIG. 2.
Figure 7B:
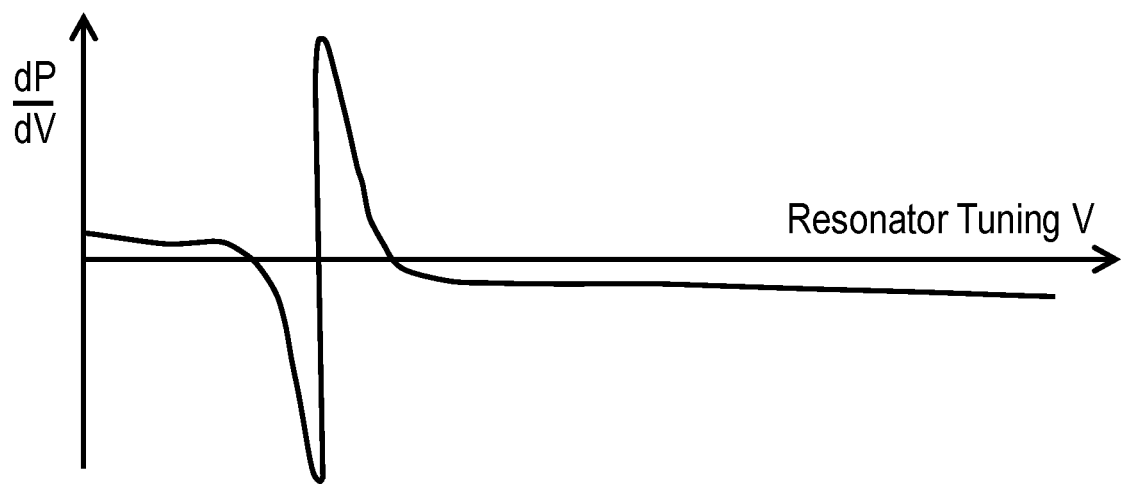

A method for the automated phase locking of the second Ti:sapphire laser 3 to the first Ti:sapphire laser 2 is detailed below:

1) The second Ti:sapphire laser 3 is initially in an unlocked state from the first Ti:sapphire laser 2. This can be achieved by turning off the feedback signal 66 to the one or more tuning elements 68, 69 and or 70 of the second Ti:sapphire laser 3;

2) The first output field 6 and the second output field 7 are then set to have the same frequency, say for example 384,227,115 MHz. The wavemeters 8 and 9 may be employed to assist with setting these frequencies. Alternatively, a single wavemeter with multiple inputs may be employed. Digital control software within the laser system 1 may be employed to automatically tune and lock the first output field 6 and the second output field 7 at these specified target wavelengths;

3) The second output field 7 is then frequency scanned whilst an output power signal 71 produced by the amplifier 46 of the first optical beat detector 29 (i.e. the electrical beat signal 47) is monitored as a function of the voltage applied to the frequency tuning elements 68 of the second Ti:sapphire laser 3. FIG. 7 presents a graph showing:
   (a) the output power signal 71; and
   (b) a derivative of the output power signal 71 as a function of the resonator voltage applied to the tuning elements 68 of second Ti:sapphire laser 3;

4) The next stage involves determining the resonator voltage at which either:
   (a) the value of the output power signal 71 drops to zero, the "zero-power voltage", see FIG. 7(*a*); or
   (b) the modulus of the differential of the output power signal 71 has a maximum value, the "maximum modulus power voltage", see FIG. 7(*b*).

These resonator voltage values correspond to the position where the frequency of the second Ti:sapphire laser 3 would be at, or close to, the frequency of the first Ti:sapphire laser 2;

6) The resonator voltage supplied to the second Ti:sapphire laser 3 is then set to:
   (a) the zero-power voltage; or
   (b) the maximum modulus power voltage.

This provides a starting point for the operating frequency of the second Ti:sapphire laser 3;

7) The predetermined offset between the first output field 6 and the second output field 7 is then selected, say for example +6,835 MHz;
8) A low gain feedback signal 66 to the tuning elements 69 and 70 of the second Ti:sapphire laser 3 is then applied. This is achieved by setting the error amplifier 67 to operate with a low gain value. The purpose of the low gain value is to enable lock capture;
9) An iterative control method is then applied to the resonator voltage of the feedback signal 66 supplied to the second Ti:sapphire laser 3 to converge the resonator voltage towards an estimated value where the frequency offset between the first output field 6 and the second output field 7 corresponds with the predetermined offset value.
10) Once the convergence of the resonator voltage is within a desired tolerance level, the resonator voltage is set to this estimated value and a high gain feedback signal 66 to the one or more tuning elements 68 and or 69 and or 70 of the second Ti:sapphire laser 3 is then applied. This is achieved by setting the error amplifier 67 to operate with a high gain value. The high gain setting is required to achieve noise reduction.

In this way, automated phase locking is achieved by a timed, phased transition from the low gain settings to the high gain settings of the error amplifier. The applicants have found this to be an important aspect of the automation process of the laser system 1 as this enables both lock capture and low noise. In practice, the laser system 1 is configured to carry out a timed, phased transition between these two gain settings. Following the initial command to switch from low to high gain settings, elements of the control circuit (additional resistors, capacitors, gain, amplifiers) are switched on in a timed sequence; parameter values may be ramped from their initial to their final value at a predefined rate and following a predefined time-delay. The sequence is configured through the GUI. Once, configured, the process is fully automatic, i.e. proceeds following the command to switch from low to high gain. The command can be sent from the GUI or via an Ethernet (TCP/IP) instruction.

In practice, the high gain setting is delivered by a triple stage amplifier having three amplifiers located in series. This has the advantage that it can be configured to have triple-integral gain at low frequency i.e. each amplifier is configured as an integrator. With the gain rising as −18 dB/octave (−60 dB/decade) this gives rise to a very high level of in-loop gain at low frequency. This is advantageous for removing components of the relative phase noise at low Fourier frequencies where the first 2 and second Ti:sapphire lasers 3 exhibit most noise.

In a first embodiment, the iterative control method applied to the resonator voltage may employ the use of a phase frequency detector (PFD) 72 located within the phase-lock feedback loop electrical circuit 49. In this embodiment, the input signals to the phase frequency detector 72 are provided by the secondary beat signal 62 (generated by the first frequency mixer 61) and the second reference signal 53 (generated by the second local oscillator 60, namely the first Direct Digital Synthesiser (DDS)).

In an alternative embodiment, a single frequency mixer may be employed. In this embodiment, the first reference signal 52, provided by the first local oscillator 54 and the first input signal 48 are arranged to be the input signals to the phase frequency detector 72.

Figure 8:
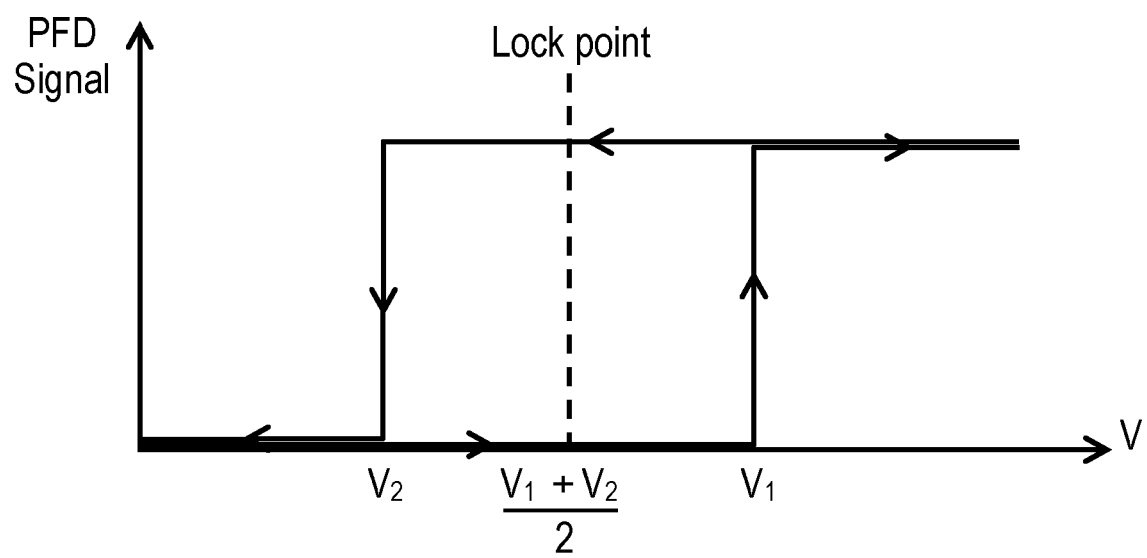
FIG. 8 presents a graph showing the output signal produced by a phase frequency detector (PFD) of the phase-locked feedback loop as a function of the feedback voltage applied to one or more frequency tuning elements of the second Ti:sapphire laser of the laser system of FIG. 2.

The output signal 73 of the phase-frequency detector (PFD) 72 is then monitored. FIG. 8 presents the output signal 73 as a function of the resonator voltage employed to drive frequency of the slaved second Ti:sapphire laser 3. This output signal 73 can be seen to be hysteretic in nature, flipping between a binary high and low signal when the frequency of the second output field 7 is offset from the first output field 6 by the predetermined offset value. A converging method can then be applied to the output signal 73 to determine the midpoint voltage between the binary high and low signals to within a desired tolerance level which corresponds to the second output field 7 being at the first predetermined offset from the first output field 6.

It will be appreciated by the skilled reader that the iterative control method applied to the output signal 73 may comprise a bisection method, as detailed below:

1) For high/low lock point the resonator voltage applied to the second Ti:sapphire laser 3 is tuned up or down from the zero-power voltage or the maximum modulus power voltage;
2) The resonator voltage, $V_1$, at which the PFD changes state is then recorded;
3) The resonator voltage is then reversed and the resonator voltage, $V_2$, at which the PFD state changes back to its original state is recorded;
4) An estimate for the resonator voltage at which the frequency of the second output field 7 is offset by from first output field 6 by the first predetermined offset value is made i.e. the value half-way between the recorded values of $V_1$ and $V_2$, i.e. $(V_1+V_2)/2$ (see FIG. 8);
5) The resonator voltage is then reversed so as to tune in the same direction as at 1);
6) The resonator voltage, $V_1$, at which the PFD changes state is again recorded;
7) The direction of the resonator voltage is reversed again and the resonator voltage, $V_2$, at which the PFD state changes back to its original state is again recorded;
8) A second estimate for the resonator voltage at which the frequency of the second output field 7 is offset by from first output field 6 by the first predetermined offset value is again i.e. the value half-way between the final values of $V_1$ and $V_2$, $(V_1+V_2)/2$; and
9) Steps 5 to 8 are then repeated, scanning backwards and forwards, a pre-set number of times or until the values of $V_1$ and $V_2$ converge on a constant value or the derived value, $(V1+V2)/2$, converges on a constant value (within some tolerance).

It will be further appreciated that other known converging methods may be alternatively be employed within the above described automated phase locking methodology.

In an alternative, and potentially more accurate embodiment, the iterative control method applied to the resonator voltage may involve a direct measurement of the beat frequency with an RF frequency counter. This measured frequency can then be compared with the first predetermined frequency offset frequency and the resonator voltage adjusted to minimise the difference between these values.

Generation of a Pulsed Output

Figure 2:
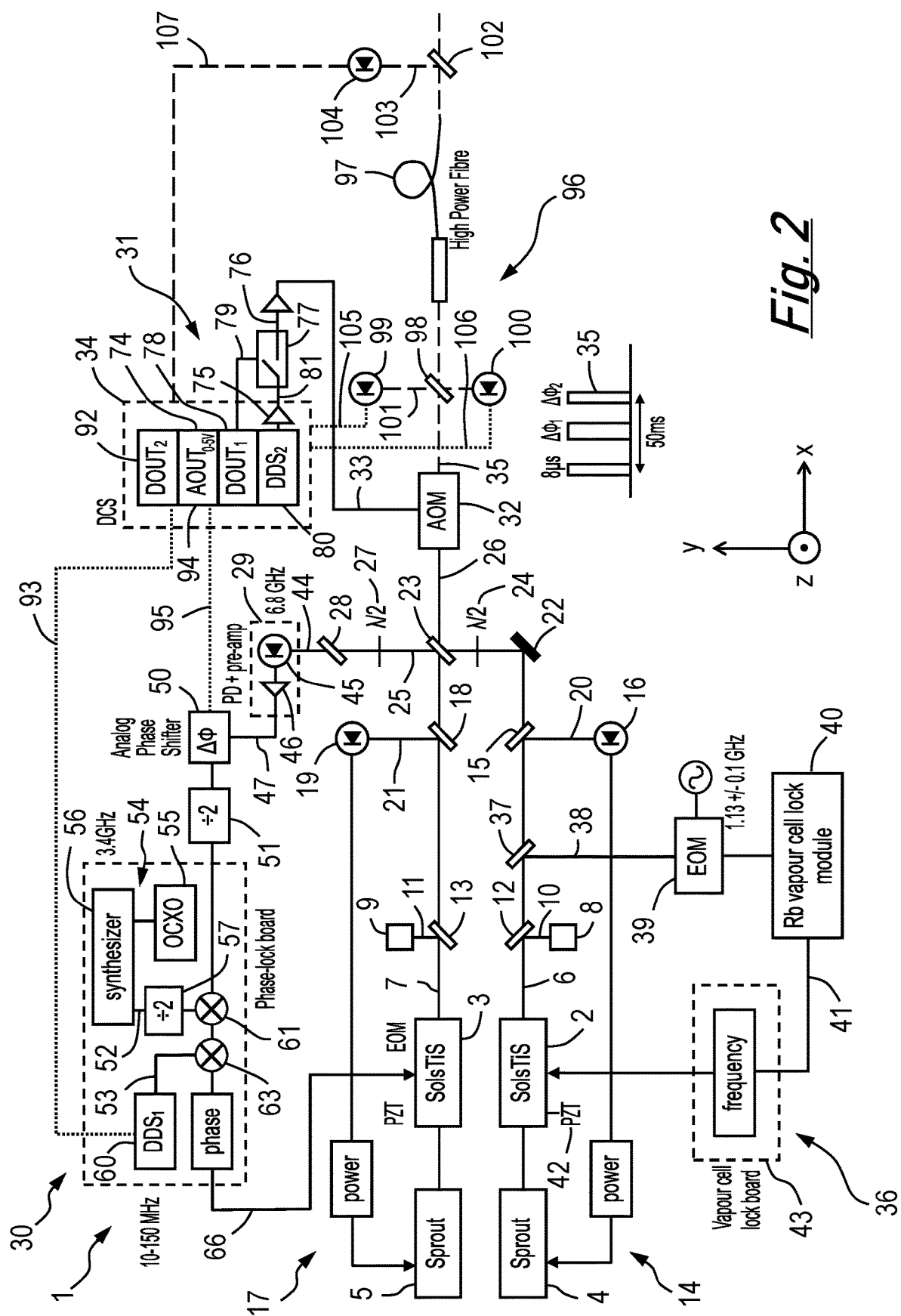
FIG. 2 presents a schematic representation of a laser system in accordance with an embodiment of the present invention.

As described above, the second combined continuous-wave field 26 comprises orthogonally, linearly, polarised components of the first output field 6 and the second output field 7 and is arranged to propagate along the x-axis to be incident upon the acoustic optic modulator system 31, a schematic representation of which is provided in FIG. 2.

In the embodiment presented in FIG. 2, the AOM electrical circuit 34 can be seen to comprise a distributed control system (DCS) 74 that is electrically connected to the first AOM 32 by a first variable gain amplifier (VGA) 75. The first VGA 75 is preferably an integrated component of the distributed control system (DCS) 74.

An electrical output 76 from the first VGA 75 is controlled by a first digital switch 77. The distributed control system (DCS) 74 further comprises a first digital output source 78, employed to provide a control signal 79 to open and close the first digital switch 77. The distributed control system (DCS) 74 further comprises a second direct digital synthesiser (DDS) 80 employed to generate a low frequency source 81 e.g. at 80 MHz for the first AOM 32.

The AOM electrical circuit 34 generates the input drive signal 33 for the first AOM 32 by employing the combined effects of the first variable gain amplifier (VGA) 75 and the first digital switch 77. In particular, the first variable gain amplifier (VGA) 75 provides a means for converting the 80 MHz output 81 from the second DDS 80 to produce a pulsed electrical input 76 Opening and closing of the first digital switch 77 provides a means for increasing the on/off extinction of the pulses. It may also provide a means for increased control for the timing and width of the pulses within the electrical input 76. The first VGA 75 also provides a means for determining the shape of the electrical pulses 76 within the series. When the first AOM 32 receives by the input drive signal 33 it acts to impart the profile of the series of pulses of the electrical input 76 onto both components of second component of the combined continuous-wave field 26 to produce the desired pulsed output field 35.

An alternative acoustic optic modulator system 31b will now be described with reference to FIG. 9. The acoustic optic modulator system 31b of FIG. 9 shares a number of components in common with the acoustic optic modulator system 31 of FIG. 2 and so like parts are marked with the same reference numerals. However, in the presently described embodiment the acoustic optic modulator system 31b comprises a second AOM 82 and an AOM electrical circuit 34b adapted to comprise a distributed control system (DCS) 74b that is electrically connected to the second AOM 82 by a second variable gain amplifier (VGA) 83, the electrical output 84 from which is controlled by a second digital switch 85. The distributed control system (DCS) 74b also comprises a second digital output source 86. employed to provide a control signal 87 to open and close the second digital switch 85. In the presently described embodiment a third direct digital synthesiser (DDS) 88 is employed to generate an extremely agile low frequency source 89 e.g. at 80 MHz for the second AOM 82.

In this embodiment, it is the combined effects of the driven first 32 and second 82 AOMs that impart the pulsed profile of the electrical outputs 76 and 84 onto both components of second combined continuous-wave field 26 to produce the desired pulsed output field 35b. As presented by the arrows marked "A" and "X" within FIG. 4, both the driven first 32 and second 82 AOMs also act to contribute 80 MHz to the frequency of the first output field 6 and the second output field 7.

The acoustic optic modulator system 31b has the advantage that it exhibits higher levels of extinction in the dark time between programmed optical pulses of the generated pulsed output field 35 when compared to the acoustic optic modulator system 31 design of FIG. 2. In addition, acoustic optic modulator system 31b offers greater flexibility of operation when compared to the acoustic optic modulator system 31. For example, the first driven AOM 32 may be employed primarily to produce pulse shaping while the second driven AOM 82 may be employed to determine the power of each of the pulses of the generated pulsed output field 35b.

It will be appreciated by the skilled reader that the combined effects of the variable gain amplifiers (VGA) 75 and 83 and their associated the digital switches 77 and 85, allow the acoustic optic modulator system 31 and 31b to generate pulsed output field 35 and 35b having a variety of pulse widths, separation and shape e.g. square pulses, Blackman pulses etc. The particular pulse widths, separation and shape chosen can be selected by a user depending upon the application for which the laser system 1 is to be deployed. In practice the timing jitter between the pulses is less than 1 ns while the timing resolution is reduced to around 50 ns.

The pulsed output field 35 and 35b are generated from the first laser output field 6 and the second laser output field 7 combined at the first polarising beam-splitting plate 23 the share a common path throughout the remainder of the laser system 1. This provides the advantage that any noise introduced within pulsed output field 35 and 35b by the acoustic optic modulator system 31 and 31b and or the high power optical fibre 97 is common to both components of the pulsed output field 35 and 35b.

A further alternative acoustic optic modulator system 31c will now be described with reference to FIG. 10. The acoustic optic modulator system 31c of FIG. 10(a) shares a number of components in common with the acoustic optic modulator systems 31 of FIGS. 2 and 31b of FIG. 9, so like parts are marked with the same reference numerals. However, for ease of understanding the AOM electrical circuit 34 is not presented within FIG. 10(a). In the presently described embodiment the acoustic optic modulator system 31c comprises a third AOM 90 and a fourth AOM 91. Exemplary control signals for the variable gain amplifiers, and digital switches, associated with each of the AOMs 32, 82, 90 and 91 is presented within FIG. 10(b).

The acoustic optic modulator system 31c provides a means for splitting the generated pulsed output field 35 into three distinct outputs 35c, 35d, and 35e. Each of the three outputs 35c, 35d, and 35e is controlled by a combination of two of the AOMs 32, 82, 90 and 91. The first AOM 32, employed to generate the pulse sequence, is common to all outputs 35c, 35d, and 35e. The AOMs 82, 90 and 91 in each particular output path is used to set the attributes of the outputs 35c, 35d, and 35e from that path; for example, it may be used to set the power level of the output (using the variable gain amplifiers), or to turn the output on or off (using the variable gain amplifiers and digital switches). As a result three outputs 35c, 35d, and 35e addressing three orthogonal axes (X, Y, Z) can be generated from the laser system 1 which finds particular application within atomic interferometry.

Frequency Chirp Control

Within some of the above described coherently controlled quantum experiments it is often desirable to be able to implement arbitrary frequency sweeps during the pulse sequences of the generated pulsed output fields 35 and 35b. There now follows a description of how the laser system 1 can be employed to provide this functionality.

Figure 9:
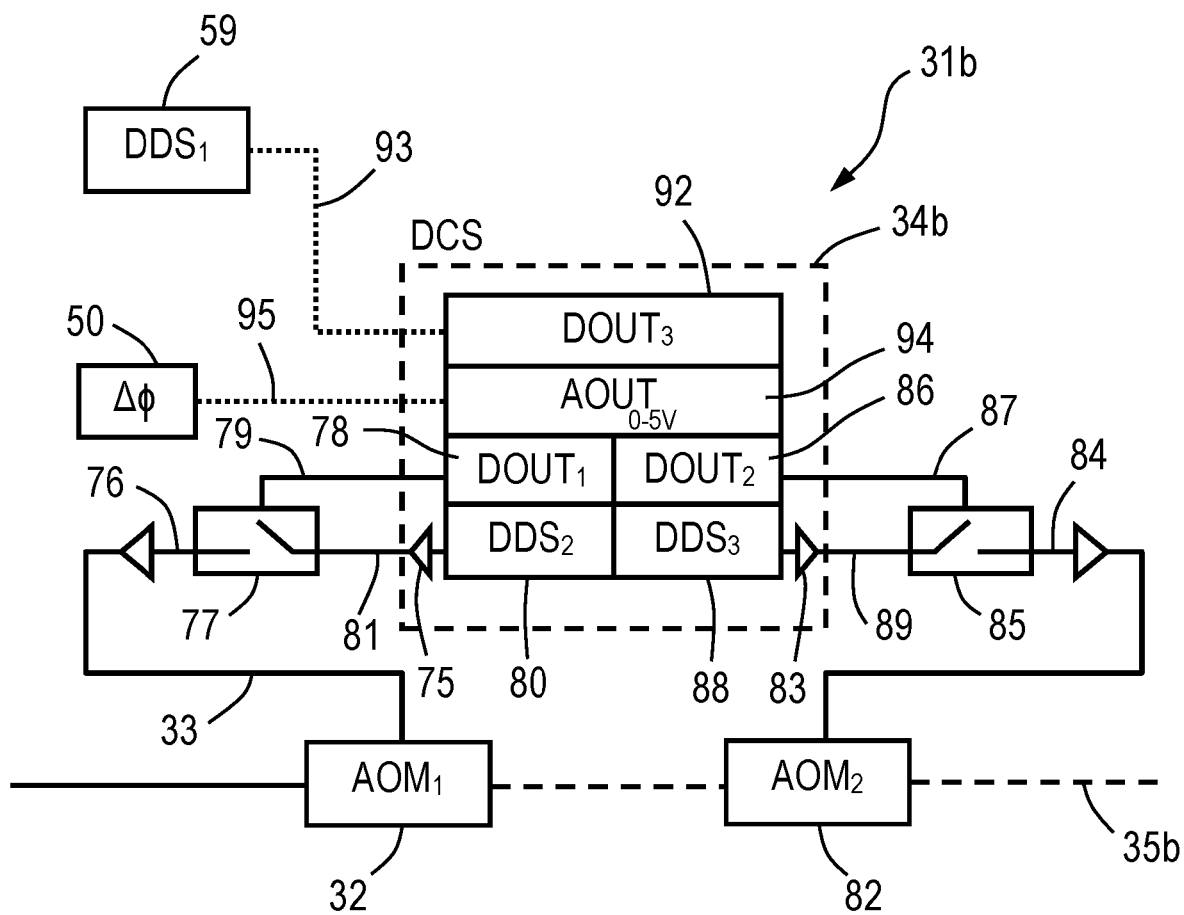
FIG. 9 presents an alternative embodiment of the acoustic optic modulator system of the laser system of FIG. 2.
Figure 10A:
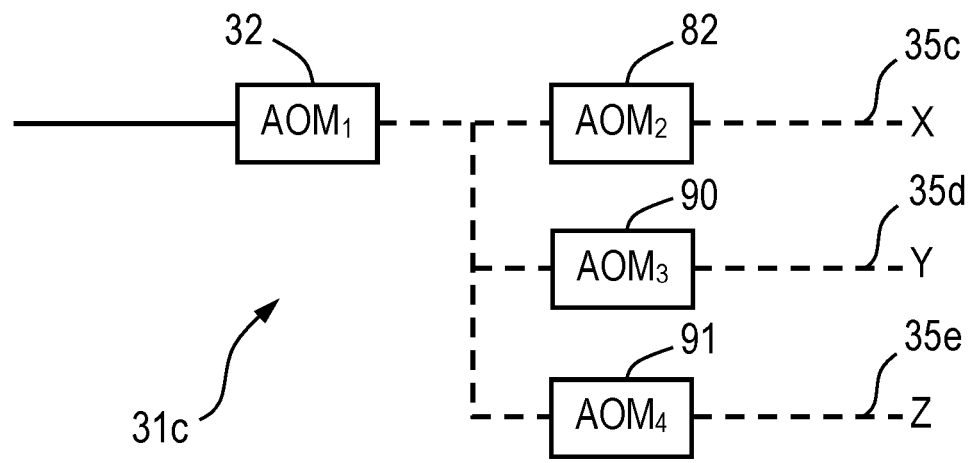
FIG. 10 presents (a) an alternative embodiment of the acoustic optic modulator system of the laser system of FIG. 2, and (b) a schematic representation of the switch and variable gain amplifier signals provided to the acoustic optic modulators of the system of FIG. 10(a)
Figure 10B:
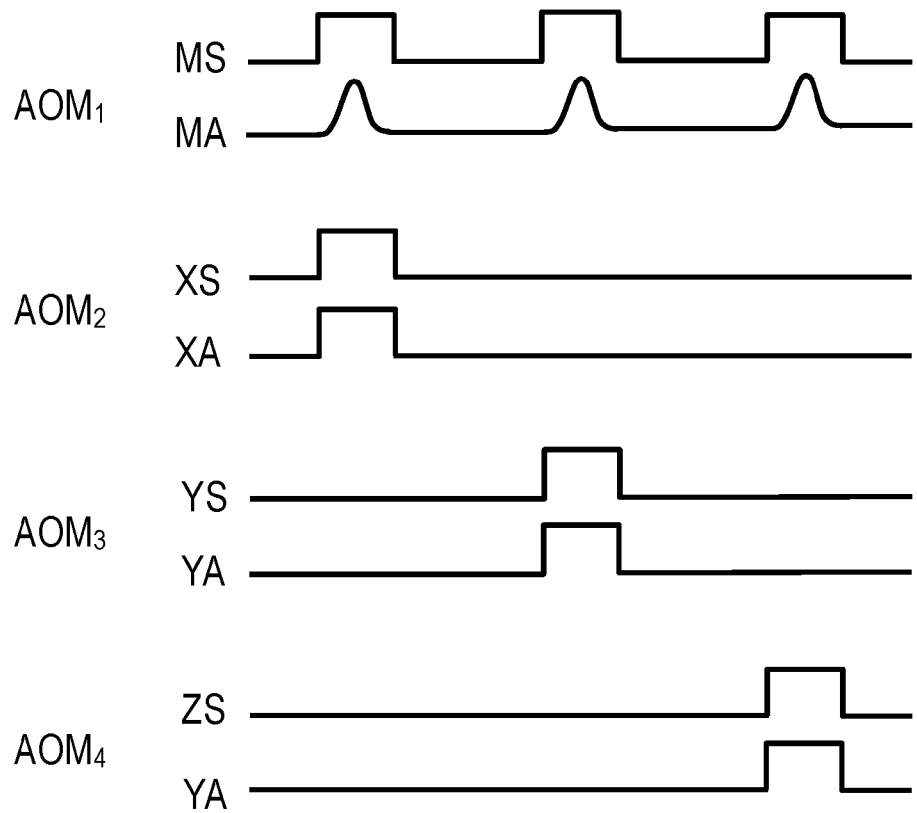

As can be seen from FIGS. 2 and 9 the distributed control systems (DCS) 74 and 74b comprise a third digital output source 92 that provides a digital control signal 93 to the first direct digital synthesiser 60 located within the phase-lock feedback loop electrical circuit 49. When the digital output source 92 is activated, the digital control signal 93 activates the first direct digital synthesiser 60 to have its output frequency altered in a controlled manner i.e. a predetermined frequency chirp is imparted upon the second reference signal 53. This frequency chirp induced upon the second reference signal 53 is input to the second frequency mixer 63. Since the phase locking feedback loop 30 is arranged to minimise the output error signal 65 this results in the feedback signal 66 changing the frequency of the second output field 7 produced by the second Ti:sapphire laser 3 i.e. one or more tuning elements of the second Ti:sapphire laser 3, namely the slow piezo-electric crystal 68 and the fast piezo-electric crystal 69 upon which one of the laser cavity mirrors is mounted, and the intracavity electro-optic modulator 70 are adjusted in response the feedback signal 66 in order to minimise the output error signal 65. This results in a frequency chirp being imparted upon the component of the second combined continuous-wave field 26 provided by the second output field 7. By employing the distributed control systems (DCS) 74 and 74*b* the timing of this frequency chirp can be accurately controlled to enable to predetermined frequency chirps to be introduced throughout the pulse sequence of the generated pulsed output fields 35 and 35*b*.

The purpose of introducing this controlled the frequency chirp is to provide the generated pulsed output fields 35 and 35*b* with a means to compensate for the Doppler shift between the atoms, which are accelerating, and the laser beam within the application system.

Phase Shift Control

Within some of the above described coherently controlled quantum experiments it is often desirable to be able to implement arbitrary phase shifts between pulses of the generated pulsed output fields 35 and 35*b*. There now follows a description of how the laser system 1 can be employed to provide this functionality.

As can be seen from FIGS. 2 and 9 the distributed control systems (DCS) 74 and 74*b* comprise an analogue output source 94 that provides an analogue control signal 95 having a voltage between 0 and 10 Volts to the analogue phase shifter 50 located within the phase-lock feedback loop electrical circuit 49. When the analogue control signal 95 has a value above 0 Volts, the analogue phase shifter 50 introduces a predetermined phase shift to the electrical beat signal 47 which in turn introduces an offset on the output error signal 65. Since the phase locking feedback loop 30 is arranged to minimise the output error signal 65 this results in the feedback signal 66 changing the frequency of the second output field 7 produced by the second Ti:sapphire laser 3 i.e. one or more tuning elements of the second Ti:sapphire laser 3, namely the slow piezo-electric crystal 68 and the fast piezo-electric crystal 69 upon which one of the laser cavity mirrors is mounted, and the intracavity electro-optic modulator 70 are adjusted in response the feedback signal 66 in order to minimise the output error signal 65. This results in a phase shift being imparted upon the component of the second combined continuous-wave field 26 provided by the second output field 7. By employing the distributed control systems (DCS) 74 and 74*b* the timing of these phase shifts can be accurately controlled to enable predetermined relative phase shifts to be introduced between individual pulses of the generated pulsed output fields 35 and 35*b*.

Power Output Monitors

As can be seen from FIG. 2, the pulsed output field 35 from the laser system 1 passes through a power output monitor 96 before being coupled into a high power optical fibre 97. The high power optical fibre 97 provides a means for propagating the pulsed output field 35 from the laser system 1 to its required destination.

The power output monitor 96 can be seen to comprise a sixth beam splitter 98, a fourth photodetector 99 and a fifth photodetector 100. The sixth beam splitter 98 is arranged such that a sixth pick-off field 101 is incident upon the fourth photodetector 99 thus providing a means for monitoring the power output of the laser system 1 before the pulsed output field 35 is coupled into the high power optical fibre 97.

The sixth beam splitter 98 is further arranged to direct a portion of the pulsed output field 35 to be incident upon the fifth photodetector 100 once it has propagated through the high power optical fibre 97 to the desired destination and been reflected back through the high power optical fibre 97. As a result, the fifth photodetector 100 provides a means for monitoring the power output at the destination where the pulsed output field 35 is intended to be deployed.

The power output monitor 96 may also comprise a seventh beam splitter 102 employed to generate a seventh pick-off field 103 for a sixth photodetector 104 deployed at the remote end the high power optical fibre 97. The sixth photodetector therefore provides a second means for monitoring the power output at the destination where the pulsed output field 35 is intended to be deployed.

As will be appreciated by the skilled reader, the efficiency of the laser system 1 may vary over time and so it cannot be guaranteed that the power of the pulsed output field 35 remains constant during the period of the experiment being performed by an operator. Therefore, for improved operation at accurate output power settings, it is useful for a third power feedback loop 105 to be established from the fourth photodetector 99 to the acoustic optic modulator system 31. Similarly, it is preferential for a fourth power feedback loop 106 to be established from the fifth photodetector 100 to the acoustic optic modulator system 31 and a fifth power feedback loop 107 to be established from the sixth photodetector 104 to the acoustic optic modulator system 31. In this way, the power of the pulsed output field 35 can be monitored via the fourth photodetector 99 and or the fifth photodetector 100 and or the sixth photodetector 104 to then provide automatic adjustments to the laser system 1, as required. This can be achieved by employing the feedback loops 105, 106 and 107 to provide a feedback signal as an analogue input of the DCS 74 which then acts to digitise the analogue inputs. The digitised signal then provides a means to vary the amplitude of the electrical pulse signal 76 and 84 employed to drive the first acoustic optic modulator 32 and or the second acoustic optic modulator 82.

Alternatively, the feedback loops 105 and 106 may be employed to adjust the alignment between the pulsed output field 35 and the high power optical fibre 97. As a result, the power output monitor 96 can be used to control:

1. power into the high power optical fibre 97;
2. power after the high power optical fibre 97;
3. power of the return beam after having passed twice through the high power optical fibre 97;
4. alignment of the output into the near end of the high power optical fibre 97; and
5. alignment of the return beam into the distant end of the high power optical fibre 97.

Phase Noise Monitor

A phase noise monitor 108 employed with an alternative embodiment of the laser system 1*b* will now be described with reference to FIGS. 5 and 11. For ease of understanding the following component have been omitted from the laser system 1*b*, namely:

1) the frequency locking feedback loop 36 for the first Ti:sapphire laser 2;
2) the acoustic optic modulator system 31 employed to generate the pulsed output field 35; and
3) the power output monitor 96.

To further highlight the flexibility of the system, the laser system 1*b* will be described with reference to its employment with the $4S_{1/2}$ to $4P_{1/2}$ (397 nm) atomic transition of Calcium-43 ($^{43}Ca^+$), the separation of $4S_{1/2}$ ground state being 3.2 GHz.

In a similar manner to that described above, the phase-lock feedback loop 30 is employed to phase-locking the second Ti:sapphire laser 3 to the first Ti:sapphire laser 2. This is achieved by arranging for the first Ti:sapphire laser 3 to generate the first output field 6 at 794 nm. The second Ti:sapphire laser 3 is then arranged to generate the second output field 7 at 794 nm plus a predetermined offset of 1.6 GHz.

A eighth beam splitter 109 is located within the first output field 6 to produce an eighth pick-off field 110 that is directed to the third photodetector 45 via a second beam steering mirror 111 and an ninth beam splitter 112. In a similar manner, a tenth beam splitter 113 is located within the second output field 7 to produce an ninth pick-off field 114 that is directed to the third photodetector 45 by beam splitter 112. As will be appreciated by the skilled reader, the above arrangement results in a combined continuous-wave field 25 generating an optical beat signal 44 at the frequency difference between the first output field 6 and the second output field 7, namely 1.6 GHz. The phase-lock feedback loop 30 operates by again monitoring this optical beat signal 44. This is achieved by employing the optical beat detector 29 comprising the third photodetector 45 and the first amplifier 46, to convert the optical beat signal 44 into the electrical beat signal 47.

The electrical beat signal 47 is again employed to provide the first input signal 48 to the phase-lock feedback loop electrical circuit 49. First 52 and second 53 reference signals are again generated for the phase-lock feedback loop electrical circuit 49.

In the presently described embodiment, the first reference signal 52 is generated by the first local oscillator 54 at the offset frequency between the second output field 7 and the first output field 6 i.e. ~1.6 GHz plus or minus the frequency of the second reference signal 53 i.e. the Oven Controlled Crystal Oscillator (OCXO) 55, operating at 100 MHz while the frequency synthesiser 56 is configured to multiply the output of the OCXO 55 by a predetermined factor e.g. fifteen or seventeen. This arrangement results in an extremely low noise first reference signal 52 with a frequency of around 1.5 GHz or 1.7 GHz.

The second reference signal 53 is again generated by the second local oscillator (first DDS) 60 at a frequency several orders of magnitude lower than first reference signal 52 i.e. between 10 to 150 MHz.

The first input signal 48 and the first reference signal 52 are supplied to the first frequency mixer 61 located on the phase-lock feedback loop electrical circuit 49. The first frequency mixer 61 is again employed to mix down the first input signal 48 and the first reference signal 52 to provide a secondary beat signal 62.

The secondary beat signal 62 is then supplied to a second frequency mixer 63 located on the phase-lock feedback loop electrical circuit 49 via a low pass frequency filter 64. The second reference signal 53 is also supplied to the second frequency mixer 63. The second frequency mixer 63 is therefore employed to mix down the secondary beat signal 62 and the second reference signal 53 to provide the output error signal 65 which is then employed to control the feedback signal 66 to the second Ti:sapphire laser 3 via the error amplifier 67 resulting in the second output field 7 being accurately phase-locked with the first output field 6.

Figure 11:
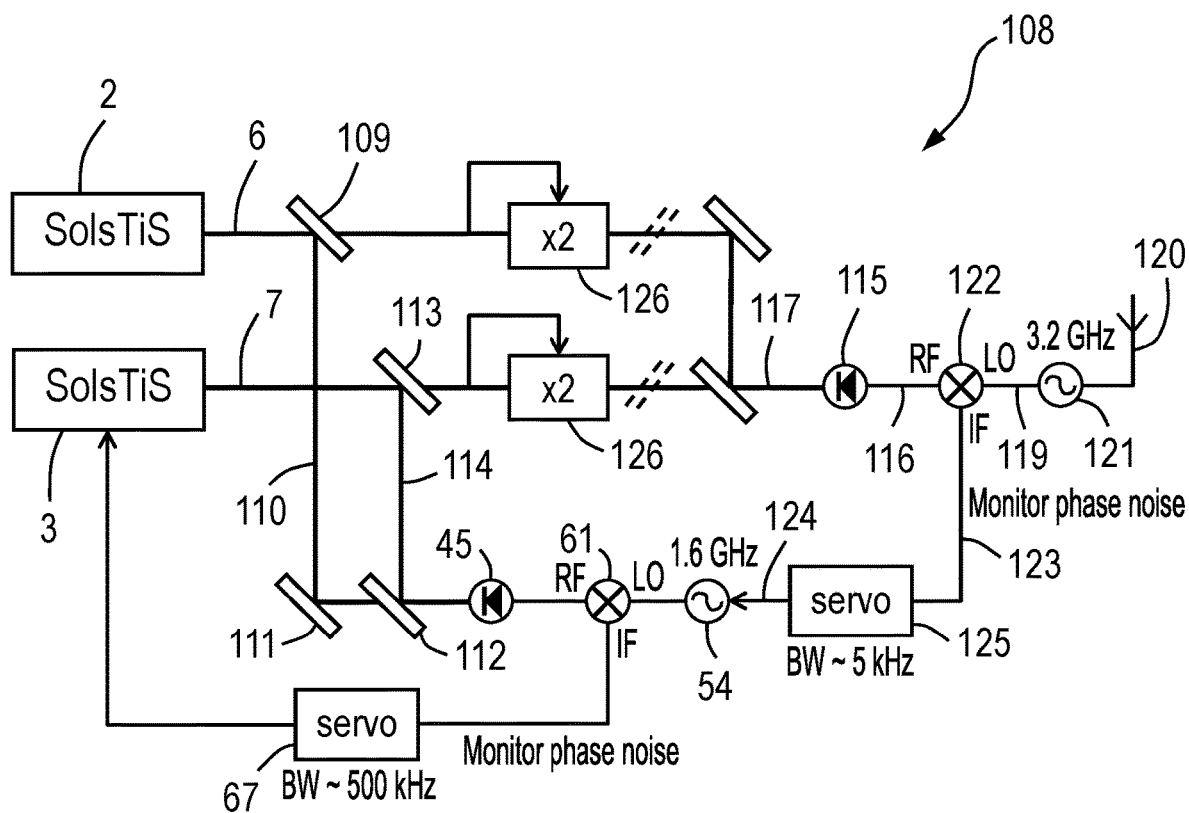
FIG. 11 presents a schematic representation of a phase noise monitor employed with an alternative embodiment of the laser system.

As indicated by the broken lines within FIG. 11, the phase noise monitor 108 may be located some distance from the Ti:sapphire lasers 2 and 3. The phase noise monitor 108 can be seen to comprise a second optical beat detector 115 that is employed to generate a second electrical beat signal 116 from a second combined field 117 of the first output field 6 and the second output field 7. The second electrical beat signal 116 is then employed to provide a second input signal 118 to the phase-lock feedback loop electrical circuit 49.

A third reference signal 119 may be generated by a third external input signal 120, which preferably, has a frequency of 100 MHz, connected to a second frequency synthesiser 121 of the phase-lock feedback loop electrical circuit 49 configured to multiply up the third external input signal 120 such that it matches the third predetermined offset frequency from the first operating frequency.

As can be seen from FIG. 5, the second input signal 118 and the third reference signal 119 are supplied to a third frequency mixer 122 located on the phase-lock feedback loop electrical circuit 49. The third frequency mixer 122 is employed to mix down the third external signal 118 and the third reference signal 119 to generate a second output error signal 123 which is then employed to control a second feedback signal 124 to the first local oscillator 54 via an auxiliary amplifier 125. In the presently described embodiment the control feedback signal 124 is provided to the OCXO 55. Alternatively, the control feedback signal 124 can be provided to an analogue phase shifter located after the OCXO 55 or the frequency synthesiser 56.

In the presently described embodiment, the second combined field 117 can be seen to be generated from frequency doubled component of the first output field 6 and the second output field 7, represented by reference numerals 6*b* and 7*b*. The frequency doubled components 6*b* and 7*b* are generated by standard frequency doubling techniques i.e. by arranging for the first 6 and second 7 output fields to propagate through a frequency doubling crystal 126, thus generating a wavelength of 397 nm. Examples of suitable frequency doubling crystals 126 include lithium niobate ($LiNbO_3$), potassium titanyl phosphate ($KTP=KTiOPO_4$), and lithium triborate ($LBO=LiB_3O_5$). As will be appreciated by the skilled reader, in this embodiment the third reference signal 119 is required to be generated at a frequency that is twice the predetermined offset between the first 6 and second 7 output fields e.g. at 3.2 GHz.

It will be appreciated that within alternative embodiments that do not employ frequency doubling crystals 126 e.g. the above describe laser system 1 configured to operate with the Rubidium-87 ($^{87}Rb$) D2 line ($5^2S_{1/2} \rightarrow 5^2P_{3/2}$), the third reference signal 119 is required to be generated at a frequency that is substantially equal to the predetermined offset between the first 6 and second 7 output fields e.g. 6,835 MHz.

The control feedback signal 124 regulated by phase noise monitor 108 effectively provides a means for monitoring and compensating for relative phase shifts introduced between the first output field 6 or 6*a* and the second output field 7 or 7*b* during experimental operation. This function is advantageous where the first output field 6 or 6*b* and the second output field 7 or 7*b* do not share a common path. The phase noise monitor 108 effectively removes any low frequency phase noise introduced within the non-common paths up to the remote point of detection by the second electrical beat signal 116. As will be appreciated by the skilled reader, this point of detection can be as close as possible to, or even beyond, the region of interaction where the relative phase-noise takes effect.

A point to note is that because the control feedback signal 124 is being employed to compensate for low frequency phase noise introduced to the laser system 1b the gain bandwidth of the auxiliary amplifier 125 can be significantly lower (~5 kHz) than for the error amplifier 67 employed within the phase-lock feedback loop 30 i.e. a gain bandwidth of ~5 kHz for the auxiliary amplifier 125 as compared to >500 kHz for the error amplifier 67.

The above described laser system offers a number of advantages over those systems known in the art. As the system is based on solid state lasers, it exhibits higher frequency configurability and inherently less frequency noise levels than those based on diode lasers. The solid-state lasers also operate at significantly higher output powers than diode lasers and thus do not require the employment of optical amplifiers which are known to induce noise, distort beam profiles and induce unwanted phase shifts between the two phase locked diode lasers.

The described laser system can be phase-locked at a user defined predetermined offset frequency (which is typically of the order of several GHz) between the operating frequencies of the first and second optical fields. This is achieved with high precision while exhibiting both low noise and high agility around the predetermined offset frequency.

The inclusion of the pulse generator provides a means for generating a series of optical pulses from the laser system, the number, duration and shape of which can all be selected by a user. In addition, the pulse generator provides a means for multiple pulsed outputs to be generated by the laser system.

In addition, the presence of the second reference signal generator within the phase-lock feedback loop provides a novel means for enabling predetermined frequency chirps to be introduced throughout a sequence of pulses contained within the output field of the laser system.

Furthermore, the incorporation of an analogue output source within the phase-lock feedback loop provides a novel means for enabling predetermined phase shifts to be introduced to individual pulses of the output field of the laser system.

The inclusion of the phase noise monitor provides a means for effectively compensating for any low frequency relative phase noise introduced upon the phased-locked output fields due to these optical fields propagating along non-common pathways.

The laser system can be made highly automated. For example, the phase-lock feedback loop electrical circuit can be employed in conjunction with the first and second wavemeters to automatically tune and lock the frequency of the first output field and the second output field. In a similar manner, phase-locking of the frequency the second output field to the first output field can made fully automated by the use of the phase-lock feedback loop electrical circuit.

Automated control of the error amplifier allows a low gain value to be set to enable lock capture before switching to a high gain setting to achieve noise reduction.

The employment of the phase-lock feedback loop electrical circuit and or the distributed control system (DCS) provides a means for controlling the phase-locking and or the pulse generation within the laser system. The configuration of the pulse sequence and phase-lock parameters can be carried out using remote Ethernet (TCP/IP) commands. This can be done prior to initialising the sequence and, also, on the "fly" during the course of the sequence. The start of the sequence may also be triggered by a digital input on the DCS (digital trigger), thus enabling synchronisation of the laser system with the control system of the application within which it is being deployed.

The distributed control system (DCS) also allows for high speed control of the pulsed output from the laser system. This allows a user to easily set pulse powers, widths, separation and shape depending upon the application for which the laser system is to be deployed. The distributed control system (DCS) also allows for the automatic, accurate control of the timing phase shifts and frequency chirping to be introduced throughout the pulse sequence of the generated pulsed output fields.

All of the above features render the disclosed laser system ideally suited for use within coherent control two-state quantum systems, for example atomic interferometry, gyroscopes, precision gravimeters and gravity gradiometers. The laser system also provides an ideal laser source for quantum information processing and in particular the generation and control of quantum bits or qubits based on hyperfine levels in trapped ions.

A laser system comprising two phase-locked solid-state laser sources is described. The laser system can be phase-locked at a predetermined offset between the operating frequencies of the lasers. This is achieved with high precision while exhibiting both low noise and high agility around the predetermined offset frequency. A pulse generator can be employed to generate a series of optical pulses from the laser system, the number, duration and shape of which can all be selected by a user. A phase-lock feedback loop provides a means for predetermined frequency chirps and phase shifts to be introduced throughout a sequence of generated pulses. The laser system can be made highly automated. The above features render the laser system ideally suited for use within coherent control two-state quantum systems, for example atomic interferometry, gyroscopes, precision gravimeters gravity gradiometers and quantum information processing and in particular the generation and control of quantum bits.

Throughout the specification, unless the context demands otherwise, the term "comprise" or "include", or variations such as "comprises" or "comprising", "includes" or "including" will be understood to imply the inclusion of a stated integer or group of integers, but not the exclusion of any other integer or group of integers.

Furthermore, reference to any prior art in the description should not be taken as an indication that the prior art forms part of the common general knowledge.

The foregoing description of the invention has been presented for purposes of illustration and description and is not intended to be exhaustive or to limit the invention to the precise form disclosed. The described embodiments were chosen and described in order to best explain the principles of the invention and its practical application to thereby enable others skilled in the art to best utilise the invention in various embodiments and with various modifications as are suited to the particular use contemplated. Therefore, further modifications or improvements may be incorporated without departing from the scope of the invention as defined by the appended claims.

The invention claimed is:

1. A laser system (1) comprising a first continuous-wave laser source (2) that provides a first optical field (6) at a first operating frequency ($f_m$), a second continuous-wave laser source (3) that provides a second optical field (7) at a second operating frequency ($f_s$) at a first predetermined offset frequency ($\Delta f_1$) from the first operating frequency, the first (6) and second optical fields (7) being combined to produce a combined continuous-wave optical field (25, 26), and a phase-lock feedback loop (30) that provides a means to phase-lock the second operating frequency ($f_s$) to the first operating frequency ($f_m$) from a first optical beat signal (25) produced by at least a first component of the combined continuous-wave optical field (25, 26), wherein the phase-lock feedback loop (30) comprises a first optical beat detector (29) that provides a means for converting the first optical beat signal (25) to a first electrical beat signal (47), a first reference signal generator (54) that provides a means for generating a first reference signal (52) at a second predetermined offset frequency ($\Delta f_2$) from the first operating frequency ($f_m$), a second reference signal generator (60) that provides a means for generating a second reference signal (53) at a frequency lower than the second predetermined offset frequency ($\Delta f_2$) and a phase-lock feedback loop electrical circuit (49) that provides a means for generating a first error signal (65) from the first electrical beat signal (47), the first reference signal (52) and the second reference signal (53), the first error signal (65) being employed to control a feedback signal (66) for the second continuous-wave laser source (3) wherein the phase-lock feedback loop (30) further comprises a first analogue phase shifter (50) located between the first optical beat detector (29) and the phase-lock feedback loop electrical circuit (49) and an analogue output source (94) arranged to provide an analogue control signal (95) to the analogue phase shifter (50) to introduce a predetermined phase offset to the electrical beat signal (47).

2. A laser system (1) as claimed in claim 1 wherein the second predetermined offset frequency($\Delta f_2$) is of a same order of magnitude as the first predetermined offset frequency ($\Delta f_1$).

3. A laser system (1) as claimed in claim 1 wherein the frequency of the second reference signal (53) is one or more orders of magnitude lower than the frequency of the first reference signal (52).

4. A laser system (1) as claimed in claim 1 wherein the second predetermined offset frequency ($\Delta f_2$) equals the first predetermined offset frequency ($\Delta f_1$) plus or minus the frequency of the second reference signal (53).

5. A laser system (1) as claimed in claim 1 wherein the first reference signal generator (54) comprises an Oven Controlled Crystal Oscillator (OCXO) (55) connected to a frequency synthesiser (56).

6. A laser system (1) as claimed in claim 1 wherein the second reference signal generator (60) comprises a first Direct Digital Synthesiser (DDS).

7. A laser system (1) as claimed in claim 1 wherein the phase-lock feedback loop electrical circuit (49) further comprising first (61) and second frequency mixers (63).

8. A laser system (1) as claimed in claim 7 wherein the first frequency mixer (61) generates a first mixed down output signal (62) from the first electrical beat signal (47) and the first reference signal (52).

9. A laser system (1) as claimed in claim 8 wherein the second frequency mixer (63) generates the first error signal (65) by mixing down the first mixed down output signal (62) and the second reference signal (53).

10. A laser system (1) as claimed in claim 7 wherein the first electrical beat signal (47) is passed through a first electrical divider (51) before being mixed with the first reference signal (52) by the first frequency mixer (61).

11. A laser system (1) as claimed in claim 7 wherein the first reference signal (52) is passed through a second electrical divider (57) before being mixed with the first electrical beat signal (47) by the first frequency mixer (61).

12. A laser system (1) as claimed in claim 8 wherein the first mixed down output signal (62) is passed through a low pass filter (64) before being mixed with the second reference signal (53) by the second frequency mixer (63).

13. A laser system (1) as claimed in claim 1 wherein the laser system (1) further comprises a phase noise monitor (108) that provides a means for compensating for any relative phase noise introduced between the first (6) and second optical fields (7) due to the first (6) and second optical fields (7) not propagating along a common pathway.

14. A laser system (1) as claimed in claim 13 wherein the phase noise monitor (108) is arranged to receive a second optical beat signal produced by a second combined continuous-wave optical field (26, 117).

15. A laser system (1) as claimed in claim 14 wherein the phase noise monitor (108) comprises a second optical beat detector (115) that provides a means for converting the second optical beat signal (26, 117) to a second electrical beat signal (116).

16. A laser system (1) as claimed in claim 13 wherein the phase noise monitor (108) further comprises a third reference signal generator (121) that provides a means for generating a third reference signal (119) at a third predetermined offset frequency ($\Delta f_3$) from the first operating frequency($f_m$).

17. A laser system (1) as claimed in claim 16 wherein the phase-lock feedback loop electrical circuit (49) comprises a third frequency mixer (122) wherein the third frequency provides (122) a means for generating a second error signal (123) by mixing down the second electrical beat signal (116) and the third reference signal (119).

18. A laser system (1) as claimed in claim 17 wherein the second error signal (123) is employed to control a feedback signal (124) for adjusting a phase of the first reference signal (52) generated by the first reference signal generator (54).

19. A laser system (1) as claimed in claim 18 wherein adjustment of the phase of the first reference signal (52) is achieved by employing the feedback signal (124) to control the Oven Controlled Crystal Oscillator (OCXO) (55).

20. A laser system (1) as claimed in claim 18 wherein adjustment of the phase of the first reference signal (52) is achieved by controlling a second analogue phase shifter located after the OCXO (55) or the frequency synthesiser (56).

21. A laser system (1) as claimed in claim 16 wherein the third predetermined offset frequency ($\Delta f_3$) is equal to the first predetermined offset frequency.

22. A laser system (1) as claimed in claim 1 wherein the laser system (1) further comprises a frequency locking feedback loop (36) that provides a means for employing a component (38) of the first optical field (6) to maintain the first operating frequency ($f_m$).

23. A laser system (1) as claimed in claim 22 wherein the frequency locking feedback loop (36) provides a means for employing the component (38) of the first optical field (6) to maintain the first operating frequency ($f_m$) at a predetermined offset frequency from an atomic transition (E).

24. A laser system (1) as claimed in claim 1 wherein the laser system (1) further comprises a first power feedback loop (14) comprising a photodetector (16) arranged to provide feedback from the first output field (6) to a pump source (4) of the first continuous-wave laser source (2).

25. A laser system (1) as claimed in claim 1 wherein the laser system (1) further comprises a second power feedback loop (17) comprising a photodetector (19) arranged to provide feedback from the second output field (7) to a pump source (5) of the second continuous-wave laser source (3).

26. A laser system (1) as claimed in claim 1 wherein the laser system further comprises a pulse generator—employed to generate a series of optical pulses (35) from the second component (26) of the combined continuous-wave optical field (25, 26).

27. A laser system (1) as claimed in claim 1 wherein a third digital output (93) is arranged to trigger the second reference signal generator (60) to generate a second reference signal (53) with a predetermined frequency chirp.

28. A laser system (1) as claimed in claim 27 wherein the third digital output (93) is generated by the distributed control system (DCS) (74).

29. A laser system (1) as claimed in claim 1 wherein the analogue output source (94) is located on the distributed control system (DCS) (74).

30. A method of configuring a laser system (1) comprising a first continuous-wave optical field (6) having a first operating frequency ($f_m$) and a second continuous-wave optical field (7) having a second operating frequency ($f_s$), the method comprising:
  setting the second operating frequency ($f_s$) to a first predetermined offset frequency ($\Delta f_1$) from the first operating frequency ($f_m$);
  combining the first (6) and second (7) optical fields to produce a combined continuous-wave optical field (25, 26);
  generating a first optical beat signal (25) from at least a first component of the combined optical field (25, 26);
  converting the first optical beat signal (25) to a first electrical beat signal (47);
  generating a first reference signal (52) at a second predetermined offset frequency ($\Delta f_2$) from the first operating frequency; ($f_m$)
  generating a second reference signal (53) at a frequency lower than the second predetermined offset frequency ($\Delta f_2$);
  generating a first error signal (65) from the electrical beat signal (47), the first reference signal (52) and the second reference signal (53);
  employing the first error signal (65) to control a feedback signal (66) for the second continuous-wave optical field (7) to phase-lock the second operating frequency ($f_s$) to the first operating frequency ($f_m$)
  wherein the method further comprises employing an analogue control signal (95) to introduce a predetermined phase offset to the electrical beat signal (47).

31. A method of configuring a laser system (1) as claimed in claim 30 wherein the second predetermined offset frequency ($\Delta f_2$) is of a same order of magnitude as the first predetermined offset frequency ($\Delta f_1$).

32. A method of configuring a laser system (1) as claimed in claim 30 wherein the frequency of the second reference signal (53) is one or more orders of magnitude lower than the frequency of the first reference signal (52).

33. A method of configuring a laser system (1) as claimed in claim 30 wherein the second predetermined offset frequency ($\Delta f_2$) equals the first predetermined offset frequency ($\Delta f_1$) plus or minus the frequency of the second reference signal (53).

34. A method of configuring a laser system (1) as claimed in claim 30 wherein generating the first error signal (65) comprises generating a first mixed down output signal (62) from the first electrical beat signal (47) and the first reference signal (52).

35. A method of configuring a laser system (1) as claimed in claim 34 wherein the first error signal (65) further comprises generating a second mixed down output signal from the first mixed down output signal (62) and the second reference signal (53).

36. A method of configuring a laser system (1) as claimed in claim 34 wherein the first electrical beat signal (47) is divided before being mixed with the first reference signal (52).

37. A method of configuring a laser system (1) as claimed in claim 34 wherein the first reference signal (52) is divided before being mixed with the first electrical beat signal (47).

38. A method of configuring a laser system (1) as claimed in claim 35 wherein the first mixed down output signal (62) is low pass filtered before being mixed with the second reference signal (53).

39. A method of configuring a laser system (1) as claimed in claim 30 wherein the method further comprises compensating for any relative phase noise introduced between the first (6) and second (7) optical fields due to the first (6) and second (7) optical fields not propagating along a common pathway.

40. A method of configuring a laser system (1) as claimed in claim 39 wherein compensating for any relative phase noise comprises generating a second optical beat signal from a second combined continuous-wave optical field (26, 117).

41. A method of configuring a laser system (1) as claimed in claim 40 wherein the first (6) and second (7) continuous-wave optical fields are frequency doubled before being combined to form the second combined continuous-wave optical field (117).

42. A method of configuring a laser system (1) as claimed in claim 40 wherein compensating for any relative phase noise further comprises converting the second optical beat signal into a second electrical beat signal (116).

43. A method of configuring a laser system (1) as claimed in claim 39 wherein compensating for any relative phase noise further comprises generating a third reference signal (119) at a third predetermined offset frequency ($\Delta f_2$) from the first operating frequency ($f_m$).

44. A method of configuring a laser system as claimed in claim 43 wherein compensating for any relative phase noise further comprises generating a second error signal (123) from the second electrical beat signal (116) and the third reference signal (119).

45. A method of configuring a laser system (1) as claimed in claim 44 wherein generating the second error signal (123) comprises mixing down the second electrical beat signal (116) and the third reference signal (119).

46. A method of configuring a laser system as claimed in claim 44 wherein compensating for any relative phase noise further comprises employing the second error signal (123) to control a feedback signal (124) to the first reference signal (52).

47. A method of configuring a laser system as claimed in claim 30 wherein the method further comprises employing a component (38) of the first optical field (6) to maintain the first operating frequency ($f_m$) at a predetermined offset frequency from an atomic transition (E).

48. A method of configuring a laser system (1) as claimed in claim 47 wherein maintaining the first operating frequency ($f_m$) comprises optically modulating the component (38) of the first optical field (6) at the predetermined offset frequency from the atomic transition (E) to provide a frequency sideband of the modulated component (38) of the first optical field (6) that is in resonance with the atomic transition.

49. A method of configuring a laser system (1) as claimed in claim 30 wherein the method further comprises monitoring the power of the first and or second continuous-wave optical field (6) and (7).

50. A method of configuring a laser system (1) as claimed in claim 49 wherein the monitored power is employed to provide feedback signal to a pump source (4) of the first continuous-wave optical field (6).

51. A method of configuring a laser system (1) as claimed in claim 50 wherein the feedback signal is employed to adjust the power of the pump source (4) and (5) of the first continuous-wave optical field (6) and or the second continuous-wave optical field (7).

52. A method of configuring a laser system (1) as claimed in claim 50 wherein the feedback signal is employed to adjust the alignment of the pump source (4) of the first continuous-wave optical field (6) and or the alignment of the pump source (5) of the second continuous-wave optical field (7).

53. A method of configuring a laser system (1) as claimed in claim 30 wherein the method further comprises generating a series of optical pulses (35) by passing a second component (26) of the combined continuous-wave optical field (25,26) through an acoustic optic modulator system (31).

54. A method of configuring a laser system (1) as claimed in claim 30 wherein the method further comprises employing a digital control signal (93) to trigger a predetermined frequency chirp to the second reference signal (53).

\* \* \* \* \*